(12) United States Patent
Liao et al.

(10) Patent No.: US 9,081,932 B2
(45) Date of Patent: Jul. 14, 2015

(54) SYSTEM AND METHOD TO DESIGN AND TEST A YIELD SENSITIVE CIRCUIT

(71) Applicant: QUALCOMM Incorporated, San Diego, CA (US)

(72) Inventors: Hongmei Liao, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/757,635

(22) Filed: Feb. 1, 2013

(65) Prior Publication Data

US 2014/0223389 A1    Aug. 7, 2014

(51) Int. Cl.
*G06F 17/50* (2006.01)
*G01R 31/3185* (2006.01)
*H01L 21/66* (2006.01)
*G06F 11/267* (2006.01)

(52) U.S. Cl.
CPC .... *G06F 17/5081* (2013.01); *G01R 31/318558* (2013.01); *H01L 22/34* (2013.01); *G06F 11/267* (2013.01); *H01L 2924/0002* (2013.01)

(58) Field of Classification Search
CPC ..... G03F 1/144; G06F 17/508; G06F 11/267; G01R 31/318547; H01L 22/34
USPC .......... 716/106, 111, 112, 132, 136; 714/724, 714/726, 727, 729
See application file for complete search history.

(56) References Cited

U.S. PATENT DOCUMENTS

| | | | |
|---|---|---|---|
| 5,748,647 A * | 5/1998 | Bhattacharya et al. ....... | 714/726 |
| 6,301,688 B1 * | 10/2001 | Roy .............................. | 716/103 |
| 6,823,496 B2 | 11/2004 | Bergman Reuter et al. | |
| 6,970,815 B1 * | 11/2005 | Bombal et al. .................. | 703/15 |
| 7,093,213 B2 * | 8/2006 | Cohn et al. ..................... | 716/119 |
| 7,194,706 B2 * | 3/2007 | Adkisson et al. ............... | 716/56 |
| 7,240,261 B2 * | 7/2007 | Huisman et al. .............. | 714/726 |
| 7,245,546 B2 * | 7/2007 | Uvieghara ................. | 365/225.7 |
| 7,263,642 B1 | 8/2007 | Makar et al. | |
| 7,370,254 B2 | 5/2008 | Rajski et al. | |
| 7,434,195 B2 | 10/2008 | Hsu et al. | |
| 7,523,429 B2 | 4/2009 | Kroyan et al. | |
| 7,536,619 B2 | 5/2009 | Satsukawa et al. | |
| 7,725,849 B2 * | 5/2010 | Abercrombie et al. ....... | 716/136 |
| 7,729,884 B2 * | 6/2010 | Huang et al. .................. | 702/185 |
| 7,735,049 B2 * | 6/2010 | Wang et al. .................... | 716/104 |
| 7,788,561 B2 * | 8/2010 | Huang et al. .................. | 714/729 |
| 7,886,238 B1 * | 2/2011 | Sharma et al. ................ | 716/132 |
| 7,904,770 B2 * | 3/2011 | Toms ............................ | 714/724 |
| 8,006,149 B2 * | 8/2011 | Dokken et al. ............... | 714/726 |
| 8,010,918 B2 * | 8/2011 | Aktouf .......................... | 716/105 |
| 8,280,687 B2 * | 10/2012 | Cheng et al. .................. | 702/185 |
| 8,280,688 B2 * | 10/2012 | Huang et al. .................. | 702/185 |
| 8,296,703 B1 * | 10/2012 | Chakravadhanula et al. | 716/112 |

(Continued)

OTHER PUBLICATIONS

International Search Report and Written Opinion—PCT/US2014/013065—ISA/EPO—May 9, 2014.

*Primary Examiner* — Helen Rossoshek
(74) *Attorney, Agent, or Firm* — Arent Fox LLP

(57) ABSTRACT

A method includes identifying at least a portion of a design of a semiconductor device to be fabricated as a yield sensitive circuit. The method also includes, in response to identifying the yield sensitive circuit, forming a scan chain. Forming the scan chain includes inserting the yield sensitive circuit between a pair of flip flops and connecting the yield sensitive circuit to the pair of flip flops.

43 Claims, 13 Drawing Sheets

(56) References Cited

U.S. PATENT DOCUMENTS

| | | | | |
|---|---|---|---|---|
| 8,316,265 B2* | 11/2012 | Guo et al. | | 714/726 |
| 8,381,144 B2* | 2/2013 | Jen et al. | | 716/106 |
| 8,453,088 B2* | 5/2013 | Akar et al. | | 716/112 |
| 8,584,073 B2* | 11/2013 | Kapur et al. | | 716/136 |
| 2004/0015798 A1 | 1/2004 | Davidson et al. | | |
| 2005/0022142 A1 | 1/2005 | Cheng et al. | | |
| 2005/0138508 A1* | 6/2005 | Huisman et al. | | 714/726 |
| 2008/0091981 A1 | 4/2008 | Dokken et al. | | |
| 2009/0281778 A1 | 11/2009 | Belledent | | |
| 2012/0110531 A1* | 5/2012 | Liao et al. | | 716/112 |
| 2012/0259574 A1 | 10/2012 | Hu et al. | | |
| 2012/0324302 A1* | 12/2012 | Arslan et al. | | 714/727 |
| 2013/0080848 A1* | 3/2013 | Jen et al. | | 714/726 |

* cited by examiner

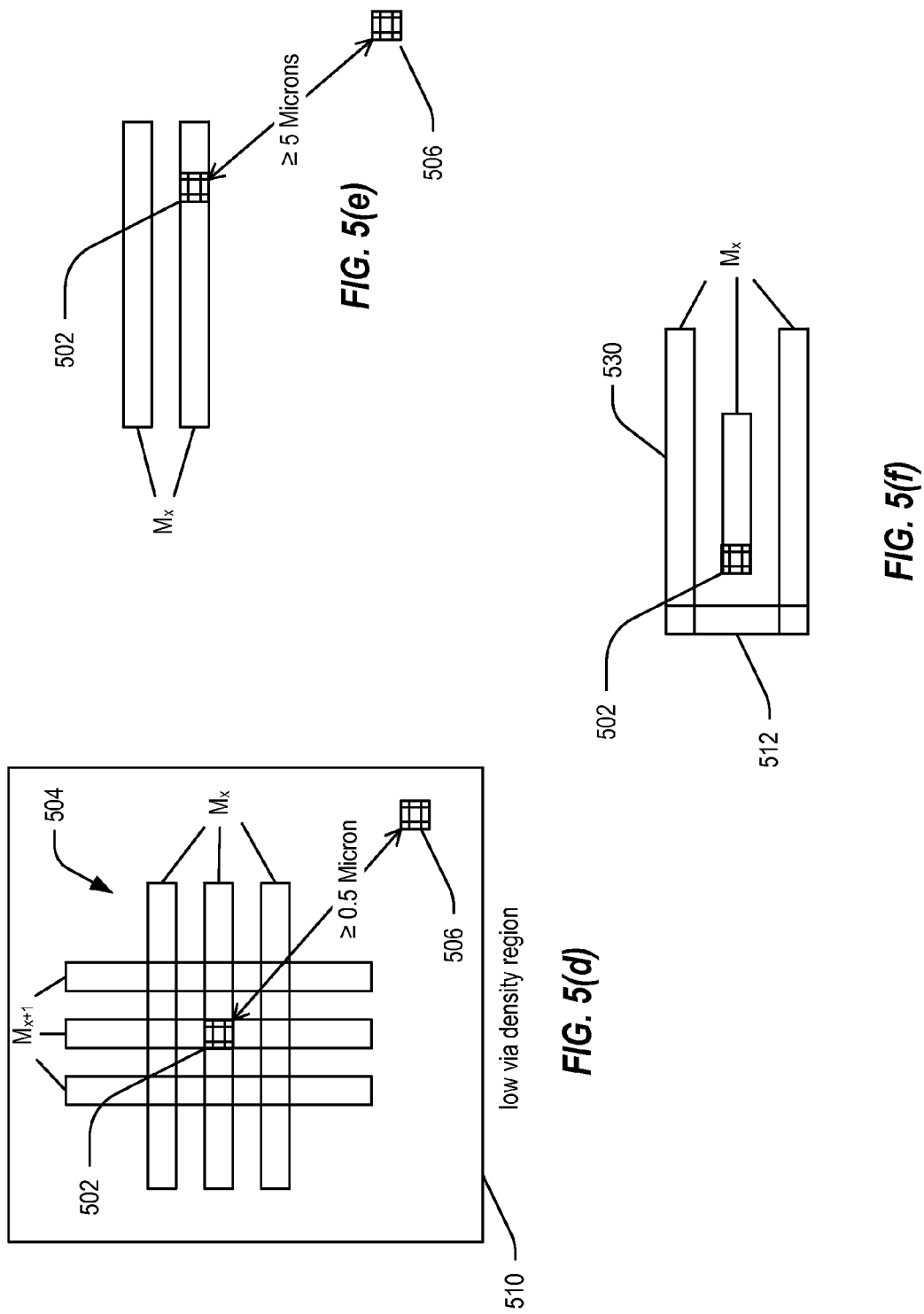

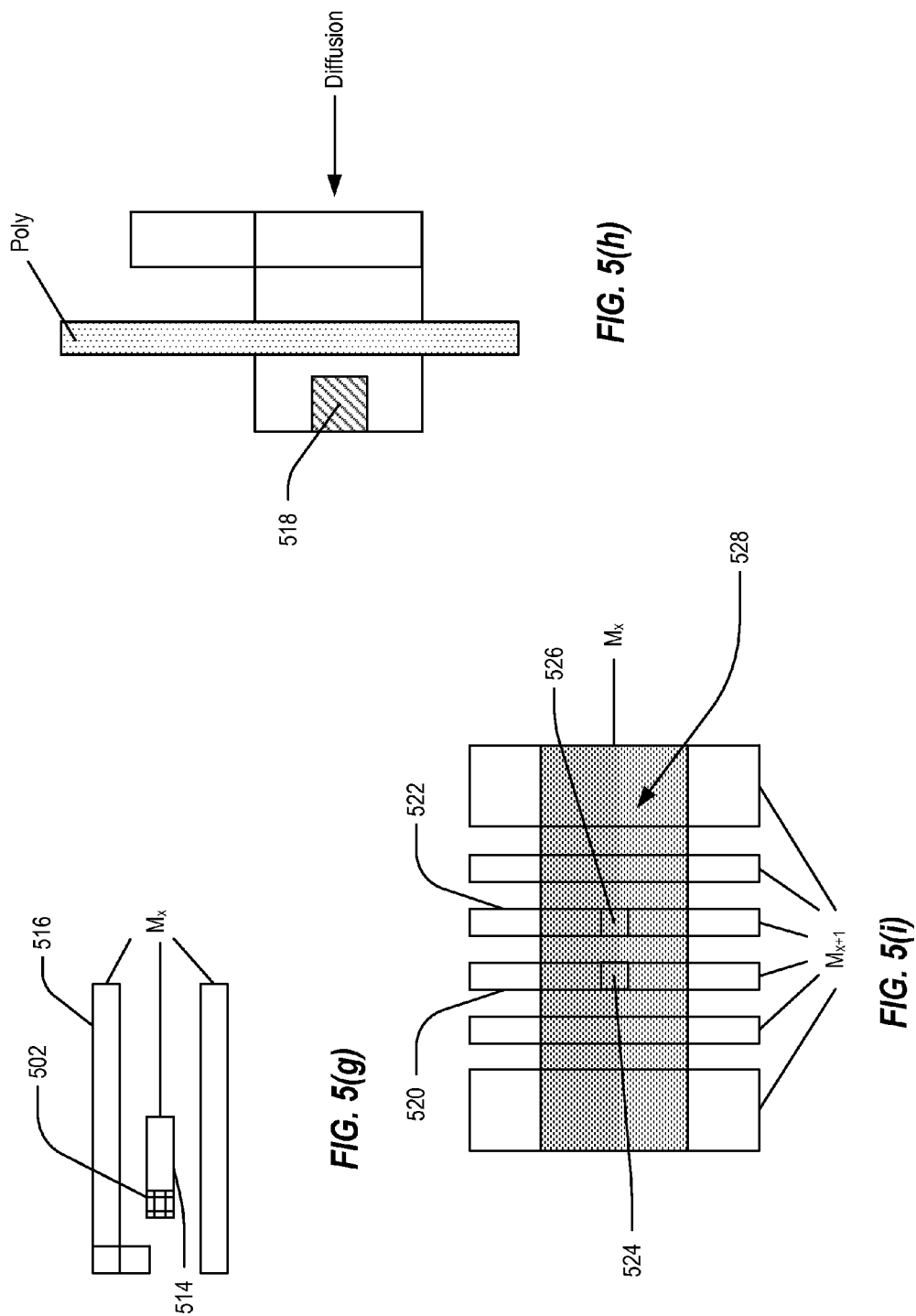

SYSTEM AND METHOD TO DESIGN AND TEST A YIELD SENSITIVE CIRCUIT

I. FIELD

The present disclosure is generally related to designing and testing of a yield sensitive circuit.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones may be manufactured as semiconductor devices. A semiconductor device may be separated into multiple functional blocks for testing. During testing, test vectors may be applied to inputs of the functional blocks and outputs from the functional blocks may be compared to expected outputs. For example, design for test (DFT) techniques such as scan tests may be used to test sequential circuits in a semiconductor device. In scan tests, a result of a scan test identifies failures (e.g., an open path in a functional block, a short path in a functional block, etc.) that contribute to yield loss (e.g., the proportion of devices on a wafer found not to perform properly) but does not identify failure locations within a functional block, such as specific layers (e.g., a diffusion layer, a polysilicon layer, a metal layer, or a via) and coordinates (e.g., X, Y, and/or Z coordinate of a functional block).

III. SUMMARY

A semiconductor device may be designed using standard cells (e.g., groups of transistors and/or interconnect structures that perform specific logic functions). A standard cell may include different layout patterns. Before a semiconductor device is fabricated, a design of the semiconductor device may be checked for design errors or design defects using a circuit design application. However, even when the design is determined to be free of design errors or design defects, some of the semiconductor devices fabricated on a silicon wafer in accordance with the design may be non-functional due to manufacturing defects. An amount of non-functional semiconductor devices on a wafer may be referred to as yield loss of the wafer.

A defect (e.g., a failure to perform an expected function) of a semiconductor device may be caused by a yield sensitive circuit (e.g., a layout pattern that may cause a failure in a functional block of the semiconductor device, a circuit that includes a layout pattern that may cause a failure in a functional block of the semiconductor device). The yield sensitive circuit may be compliant with a particular set of design rules (e.g., a layout pattern in the circuit, or the circuit, is not flagged as an error during a design rule check). However, a specific construction of layout polygons in relation to each other within the same process layer or between different layers may cause an open path, a short path, or a high resistance path during fabrication, which may lead to yield loss. Systems and methods described herein may advantageously enable designing and testing of a yield sensitive circuit using a scan chain. The scan chain may include a plurality of yield sensitive circuits and a plurality of pairs of flip flops. Each of the yield sensitive circuits may be situated between a pair of flip flops. Thus, a yield sensitive circuit and a pair of flip flops may form a part of a scan chain. The scan chain with the yield sensitive circuit may be fabricated on a semiconductor device. The fabricated device may be tested and analyzed to characterize the interaction of the yield sensitive circuit with a semiconductor device fabrication process (e.g., whether the yield sensitive circuit may cause a failure during fabrication of the fabricated semiconductor device). Thus, yield associated with fabrication of a semiconductor device having the yield sensitive circuit may be improved by modifying a chip design having the yield sensitive circuit based on the results of the characterization (e.g., replacing the yield sensitive circuit with a different layout pattern, modifying the yield sensitive circuit, reducing an amount of the yield sensitive circuits within the chip design, modifying the fabrication process, etc.).

For example, at least one proposed yield sensitive circuit may be compared to a database of layout patterns and/or circuits used in a particular design of a semiconductor device. At least a portion of the particular design (e.g., a particular layout circuit and/or pattern) may be identified as a yield sensitive circuit based on the comparison. The particular yield sensitive circuit may be designed as a design cell and the design cell may be inserted between a pair of flip flops to form a part of a scan chain in a circuit design application. The scan chain may include a plurality of pairs of flip flops. Each pair of flip flops may include at least one yield sensitive circuit. A statistically significant number of the scan chains may be populated on a test semiconductor device in the circuit design application. Other scan chains with a different yield sensitive circuit may also be populated on the test semiconductor device. The test semiconductor device with the statistically significant number of scan chains may be fabricated, and testing and failure analysis may be performed on the fabricated test semiconductor device. Based on the result of the testing and failure analysis of the fabricated test semiconductor device, the yield sensitive circuits or different variations of the yield sensitive circuits may be tested (e.g., in as many iterations as needed) to determine an amount of yield loss caused by the yield sensitive circuits. For example, certain patterns identified during the testing and failure analysis as causing failures may be designated as proposed yield sensitive circuits for a next iteration of yield sensitive circuit testing.

In the next iteration, the yield sensitive circuits identified during the testing and failure analysis that cause failures may be compared to a database of layout patterns and/or circuits to identify new yield sensitive circuits. Similar to a prior iteration, the new yield sensitive circuits may be inserted between a pair of flip flops to form a scan chain. The scan chain may be populated on a new test semiconductor device for fabrication. The new test semiconductor device may be fabricated, and testing and failure analysis may be performed on the new test semiconductor device. Other iterations may follow until design personnel determine that there is sufficient data to characterize what kind of yield loss each yield sensitive circuit may cause in the particular design of the semiconductor device. The particular design of the semiconductor device may be modified to reduce yield loss (e.g., replacing each yield sensitive circuit with a different layout pattern, modifying the yield sensitive circuit, reducing an amount of the yield sensitive circuits within the chip design, modifying the fabrication process, etc.). Knowledge and/or data gained during each iteration may be stored in the database for use in subsequent designs or fabrications.

In a particular embodiment, a method includes identifying at least a portion of a design of a semiconductor to be fabricated as a yield sensitive circuit. The method also includes, in response to identifying the yield sensitive circuit, forming a scan chain within the design. Forming the scan chain includes inserting the yield sensitive circuit between a first pair of flip flops and connecting the first pair of flip flops to the yield sensitive circuit. The scan chain may include a plurality of pairs of flip flops.

In another particular embodiment, the method further includes forming, at a computer executing a circuit design application, a particular yield sensitive circuit by combining multiple individual yield sensitive circuits. The method further includes inserting, at the computer, the particular yield sensitive circuit between a first flip flop and a second flip flop to form a part of a particular scan chain within a circuit modeled by the circuit design application.

In another particular embodiment, a method includes forming, at a computer executing a circuit design application, a yield sensitive circuit based on a double patterning technique. The method also includes inserting, at the computer, the yield sensitive circuit between a first flip flop and a second flip flop to form a part of a scan chain within a circuit modeled by the circuit design application.

In another particular embodiment, an apparatus includes a substrate. The apparatus also includes a scan chain formed on the substrate. The scan chain includes at least a first flip flop, a second flip flop, and a yield sensitive circuit configured to provide a path between the first flip flop and the second flip flop. The yield sensitive circuit is inserted between the first flip flop and the second flip flop within a design of a semiconductor device to be fabricated. After fabrication of the semiconductor device, the fabricated semiconductor device is tested and analyzed for failures using data generated by use of the scan chain with the yield sensitive circuit.

In another particular embodiment, an apparatus includes a substrate and a scan chain formed on the substrate. The scan chain includes at least a first flip flop, a second flip flop, and a yield sensitive circuit configured to provide a path between the first flip flop and the second flip flop. The yield sensitive circuit includes multiple individual yield sensitive circuits. The yield sensitive circuit is inserted between the first flip flop and the second flip flop at a computer executing a circuit design application.

One particular advantage provided by at least one of the disclosed embodiments is an ability to design and test a yield sensitive circuit using a scan chain to identify whether the yield sensitive circuit may cause yield loss in a design of a semiconductor device. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 5($b$) is a diagram of a particular illustrative embodiment of a second yield sensitive circuit;

FIG. 5($c$) is a diagram of a particular illustrative embodiment of a third yield sensitive circuit;

FIG. 5($d$) is a diagram of a particular illustrative embodiment of a fourth yield sensitive circuit;

FIG. 5($e$) is a diagram of a particular illustrative embodiment of a fifth yield sensitive circuit;

FIG. 5($f$) is a diagram of a particular illustrative embodiment of a sixth yield sensitive circuit;

FIG. 5($g$) is a diagram of a particular illustrative embodiment of a seventh yield sensitive circuit;

FIG. 5($h$) is a diagram of a particular illustrative embodiment of an eighth yield sensitive circuit;

FIG. 5($i$) is a diagram of a particular illustrative embodiment of a ninth yield sensitive circuit;

FIG. 6($a$) is a diagram of a particular illustrative embodiment of a tenth yield sensitive circuit based on a double patterning technique;

FIG. 6($b$) is a diagram of a particular illustrative embodiment of an eleventh yield sensitive circuit based on another double patterning technique;

FIG. 6($c$) is a diagram of a particular illustrative embodiment of a twelfth yield sensitive circuit based on another double patterning technique;

V. DETAILED DESCRIPTION

A semiconductor device may be designed using standard cells. A circuit design application (e.g., a software electronic design automation tool) may be executed on a computer to evaluate a design of the semiconductor device having the standard cells for errors and/or defects. However, during manufacturing, when the semiconductor device is fabricated on a wafer, some of the fabricated semiconductor devices may contain manufacturing defects and may be non-functional. Thus, the wafer containing the fabricated semiconductor devices may suffer yield loss. The non-functional semiconductor devices may have defects in layout patterns and/or circuits that include the layout patterns. The defects may be caused by a fabrication process of the semiconductor devices. Even though the layout patterns and/or the circuits in theory (e.g., as evaluated by the design application software) may not cause any defects, the fabrication process may not consistently fabricate such layout patterns and/or circuits consistently without defects.

When a new semiconductor device is to be designed and fabricated, design personnel may utilize knowledge gained from analyzing previously fabricated semiconductor devices to improve yield associated with the new semiconductor device. For example, the design personnel may have knowledge of particular layout patterns and/or circuits that have historically caused defects in semiconductor devices during fabrication. The design personnel may use a circuit design application to determine whether the particular layout patterns, the particular circuits, or variations of the particular layout patterns and/or the particular circuits are used in the design of the new semiconductor device.

When the design of the new semiconductor device includes the particular layout patterns, the particular circuits, or the variations, the particular layout patterns, the particular circuits, and/or the variations, may be identified, designed, and tested to determine whether the particular layout patterns, the particular circuits, and/or the variations, may cause defects under a fabrication process associated with the new semiconductor device. The particular layout patterns, the particular circuits, and/or the variations may form scan chains. The scan chains may be fabricated on a test semiconductor device using the fabrication process. Testing and failure analysis may be performed on the test semiconductor device to determine whether the particular layout patterns, the particular circuits and/or the variations cause any defects. An iterative testing process may be used to determine how much yield loss is caused by each of the particular layout patterns, the particular circuits and/or the variations. Based on data from the iterative testing process, the design of the new semiconductor device or the fabrication process may be updated and/or modified to reduce potential yield loss.

Figure 1:
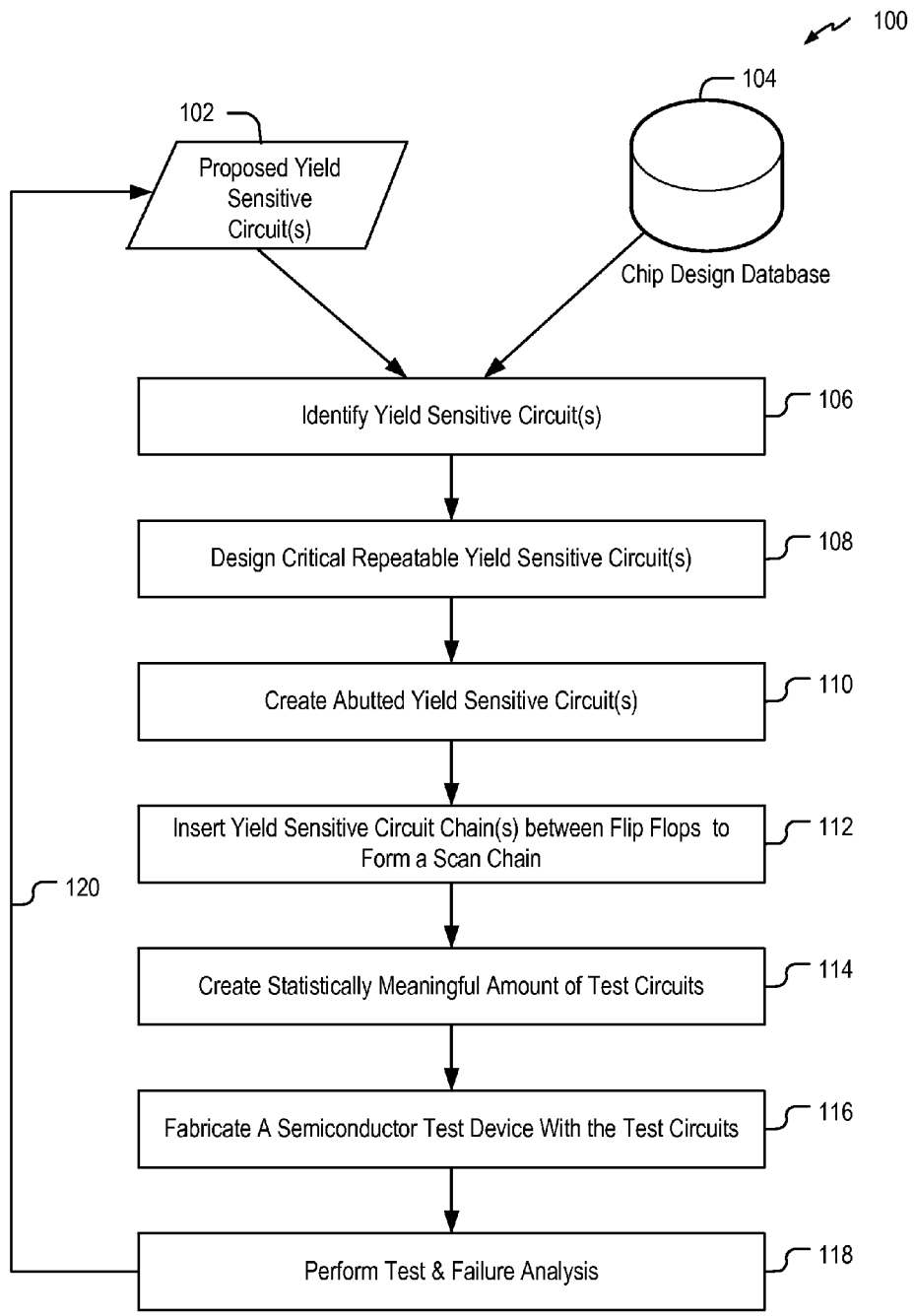
FIG. 1 is a flow chart of a particular illustrative embodiment of a method of testing a yield sensitive circuit.

Referring to FIG. 1, a particular illustrative embodiment of a method of testing a yield sensitive circuit is disclosed and generally designated 100. The method 100 includes comparing (e.g., using a circuit design application executable by a computer) a proposed yield sensitive circuit 102 (e.g., a layout pattern, a standard cell, a circuit that includes a layout pattern, etc. that is known to cause yield loss from prior analysis of fabricated semiconductor devices, a layout pattern that appears likely to cause yield loss based on previous experience, etc.) to circuits and/or layout patterns used in a design of a new semiconductor device (e.g., circuits and/or layout patterns in cells that make up the new semiconductor device) that are stored in a chip design database 104, at 106. In a particular embodiment, a plurality of the proposed yield sensitive circuits 102 is stored in a yield sensitive circuit database. Examples of yield sensitive circuits are illustrated and described with reference to FIGS. 2-6. In a particular embodiment, the proposed yield sensitive circuit 102 includes one layout pattern that is compared to the layout patterns stored in the chip design database 104. In a particular embodiment, the proposed yield sensitive circuit 102 includes a plurality of different layout patterns and each of the different layout patterns is compared to the layout patterns stored in the chip design database 104. In a particular embodiment, the proposed yield sensitive circuit 102 includes a plurality of different circuits and each of the different circuits is compared to circuits stored in the chip design database 104.

When comparing the proposed yield sensitive circuit 102 to the circuits in the chip design database 104, at least one circuit from the chip design database (or information stored in the chip design database that is related to circuits) may be evaluated to identify as a yield sensitive circuit when the at least one circuit (or information stored in the chip design database that is related to circuits) matches the proposed yield sensitive circuit 102 or a variation of the proposed yield sensitive circuit 102. In a particular embodiment, a search within the chip design database 104 is performed to identify dominant circuits. For example, a dominant circuit may be a circuit and/or layout pattern that is the most frequently used in the design of the semiconductor device. A dominant circuit may also be a circuit and/or a layout pattern that has been used a number of times that exceeds a threshold. The dominant circuits identified during the search may be designated as proposed yield sensitive circuits (for testing purposes), because a failure of a dominant circuit may have great impact on yield of the semiconductor device.

The method 100 also includes, after a yield sensitive circuit has been identified, using the circuit design application to design the yield sensitive circuit as a single design cell, at 108. In a particular embodiment, the method 100 includes forming an abutted yield sensitive circuit by abutting (e.g., connecting in series) a plurality of design cells together (e.g., through direct abutment), at 110. Examples of abutted yield sensitive circuits are illustrated and described with reference to FIGS. 3-6. Each of the plurality of design cells may have a yield sensitive circuit and/or a yield sensitive layout located at a center of each of the plurality of design cells. The method 100 further includes inserting (e.g., forming a signal path) the yield sensitive circuit (in the form of a design cell) and/or the abutted yield sensitive circuit between a pair of flip flops and connect the yield sensitive circuit and/or the abutted yield sensitive circuit to the pair of flip flops to form a scan chain using the circuit design application, at 112. In a particular embodiment, the scan chain includes multiple pairs of flip flops and each pair of the multiple pairs includes at least one yield sensitive circuit. The method 100 further includes forming multiple scan chains on a semiconductor test device to form a statistically meaningful test pattern using the circuit design application, at 114. The method 100 further includes fabricating the semiconductor test device (e.g., on a silicon substrate) with the statistically meaningful test pattern, at 116. The semiconductor test device may be fabricated at a semiconductor manufacturing location and the resulting wafers may be delivered to a design location for testing.

The method 100 further includes performing testing and failure analysis (e.g., identifying the types of defects on the fabricated test semiconductor device, identifying the amount of defects, etc.) on the fabricated semiconductor test device using data generated by use of the scan chains with the yield sensitive circuit or the abutted yield sensitive circuit, at 118. The testing and failure analysis may be performed using the circuit design application executable by the computer. For example, the data generated by use of the scan chains may indicate results of a scan chain test. The results may indicate which particular scan chains fail the scan chain test. As one or more yield sensitive circuits 102 may have been used to form a part of a scan chain, failures of the scan chain test by a particular scan chain may indicate a defect in the one or more yield sensitive circuits 102 that formed the particular scan chain.

The method 100 further includes updating the proposed yield sensitive circuit 102 with a result of the testing and failure analysis (e.g., a failure of the yield sensitive circuit detected during the testing and failure analysis), at 120. In a particular embodiment, particular circuit(s) and/or layout pattern(s) that match the yield sensitive circuit(s) are removed from the chip design database 104 based on the result of the testing and failure analysis. In this case, the design of the semiconductor device is updated to reduce and/or exclude the circuit(s) and/or particular layout pattern(s). In a particular embodiment, the failure of the yield sensitive circuit detected during the testing and failure analysis may indicate a type of failure (e.g., an open path, a short path, a high impedance path, etc.) in a layer of the semiconductor device. Reliability of a test result of the yield sensitive circuit may be enhanced by filtering the proposed yield sensitive circuit 102. For example, the updated proposed yield sensitive circuits may include fewer circuits and/or different layout patterns than the proposed yield sensitive circuit 102 (when there is a plurality of the proposed yield sensitive circuit 102) by filtering particular circuits and/or layout patterns of the proposed yield sensitive circuit 102 that may not cause yield loss based on data generated from the testing and failure analysis of the fabricated semiconductor test device. However, other particular circuits and/or layout patterns of the proposed yield sensitive circuit 102 that caused yield loss may be tested in subsequent iterations to determine a likelihood of yield loss caused by the other particular circuits and/or layout patterns.

In a next iteration, the method 100 may be repeated using the updated proposed yield sensitive circuits. For example, the updated proposed yield sensitive circuits may be compared to the circuits in the chip design database 104 to identify a second particular layout pattern that may match a second particular yield sensitive circuit. The second particular yield sensitive circuit may be inserted between a second pair of flip flops to form a part of a second scan chain within a second design of a second semiconductor test device to be fabricated. The second semiconductor test device may be fabricated with a plurality of the second scan chains using the second particular yield sensitive circuit. Further testing and failure analysis may be performed on the second semiconductor device. The method 100 may be repeated until a likelihood of a particular yield sensitive circuit or a plurality of yield sensitive circuits causing defects under a particular fabrication process is established. The method 100 may also be repeated after the design of the semiconductor device and/or the fabrication process is updated to verify that the updated design no longer has the yield sensitive circuit. In a particular embodiment, the method 100 is performed before the design of the semiconductor device is finalized (e.g., during a test phase of a development cycle of the semiconductor device). In another embodiment, the method 100 is performed after the initial design of the semiconductor device is finalized (e.g., during a production phase of the development cycle).

The design of the semiconductor device may be updated (e.g., utilizing alternative standard cells, modifying the functional blocks of the semiconductor device so that the yield sensitive circuits may be excluded, utilizing a circuit and/or a layout pattern different than the yield sensitive circuit, reducing the number of times the yield sensitive circuit is used in the design, modifying a fabrication process associated with the semiconductor device, etc.) based on the result of the testing and failure analysis of a fabricated test semiconductor device with the yield sensitive circuit. The method 100 may thus enable testing of a yield sensitive circuit using a scan chain to determine potential yield loss of a semiconductor device having the yield sensitive circuit. A design of the semiconductor device or a fabrication process associated with the semiconductor device may be modified to reduce the potential yield loss.

Figure 2:
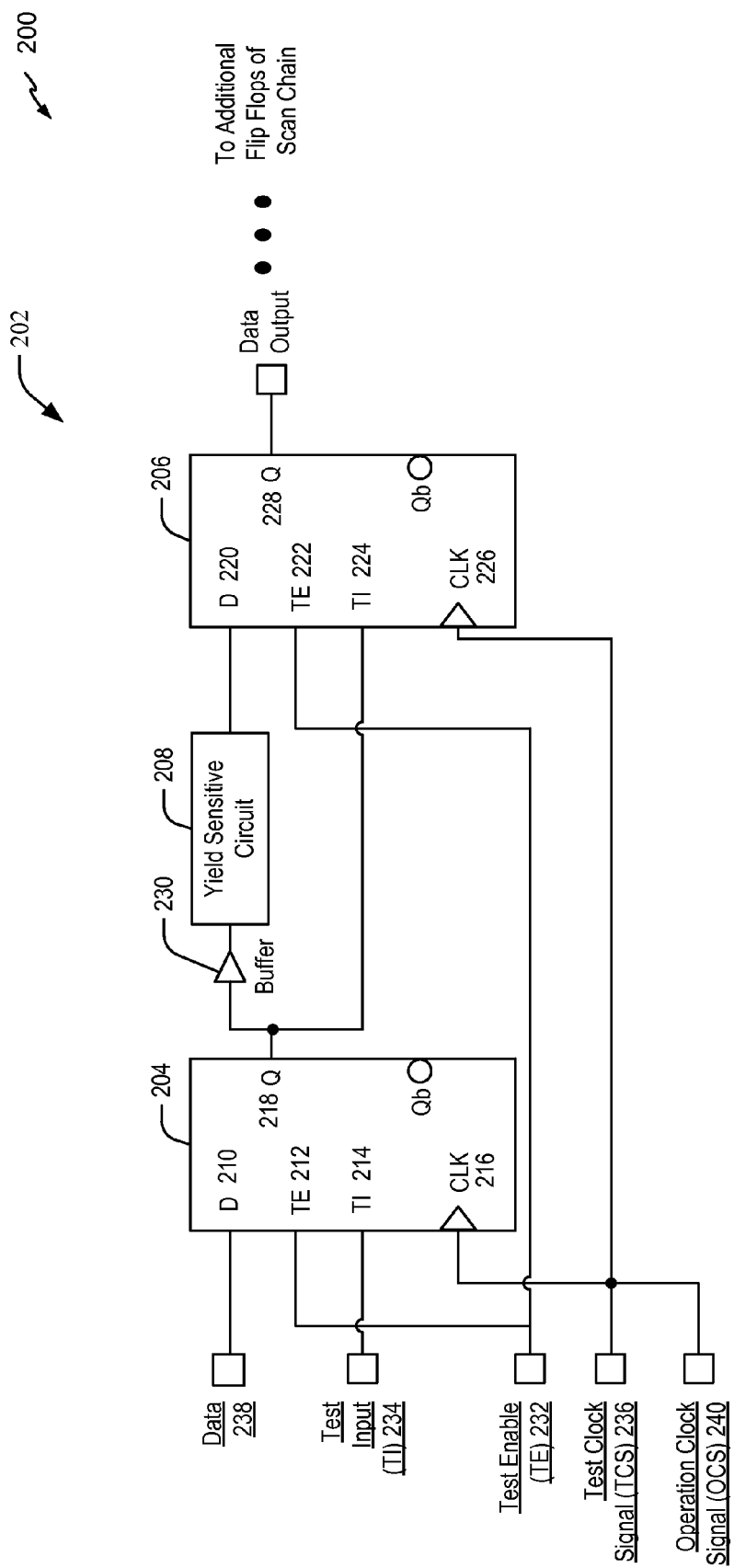
FIG. 2 is a diagram of a particular illustrative embodiment of a scan chain that includes a single yield sensitive circuit.

Referring to FIG. 2, a diagram of a particular illustrative embodiment of a scan chain 202 that includes a yield sensitive circuit 208 is disclosed and generally designated 200. In a particular embodiment, the yield sensitive circuit 208 is a two dimensional layout pattern. In another particular embodiment, the yield sensitive circuit 208 is a three dimensional layout pattern. The scan chain 202 may include at least a first flip flop 204, a second flip flop 206, and the yield sensitive circuit 208. At least a part of the scan chain 202 may be formed by coupling the first flip flop 204 and the second flip flop 206 in a design of a semiconductor device to be fabricated using a circuit design application executed by a computer. At least a part of the design may be identified as the yield sensitive circuit 208. For example, a proposed yield sensitive circuit may be compared to circuits in a chip design database that includes circuits used to design the semiconductor device. A particular circuit in the chip design database that matches the proposed yield sensitive circuit may be identified as the yield sensitive circuit 208. The yield sensitive circuit 208 may be inserted between the first flip flop 204 and the second flip flop 206 using the circuit design application.

In response to identifying the yield sensitive circuit 208, the yield sensitive circuit 208 may be inserted between the first flip flop 204 and the second flip flop 206 using the circuit design application. The yield sensitive circuit 208 may also be connected to the first flip flop 204 and to the second flip flop 206 using the circuit design application. In a particular embodiment, the first flip flop 204 and the second flip flop 206 are scannable delay flip flops and the yield sensitive circuit 208 is identified by comparing the proposed yield sensitive circuits 102 of FIG. 1 to layout patterns in the chip design database 104 of FIG. 1. The scan chain 202 may include additional pairs of flip flops. Each additional pair of flip flops may be similar to the flip flops 204 and 206. Each additional pair of flip flops may be connected to at least one yield sensitive circuit (e.g., the yield sensitive circuit 208 or a yield sensitive circuit different than the yield sensitive circuit 208).

The first flip flop 204 may include a first data input 210, a first test enable input 212, a first test input 214, a first clock input 216, and a first data output 218. The second flip flop 206 may include a second data input 220, a second test enable input 222, a second test input 224, a second clock input 226, and a second data output 228. The yield sensitive circuit 208 may be connected to the first data output 218 and the second data input 220 to act as a signal path (e.g., the yield sensitive circuit 208 may not perform any combinational logic operation) between the first flip flop 204 and the second flip flop 206. In a particular embodiment, a buffer 230 is coupled between the first data output 218 and the yield sensitive circuit 208 to introduce transition delay.

After the semiconductor device with the scan chain 202 is fabricated, the yield sensitive circuit 208 may be tested for failure. During testing of the yield sensitive circuit 208, a test enable signal 232 with a high logic value (e.g., a logic value "1") may be provided to the first flip flop 204 via the first test enable input 212 and to the second flip flop 206 via the second test enable input 222. The test enable signal 232 may cause the first flip flop 204 and the second flip flop 206 to enter into a test mode. A test input 234 (e.g., a test vector) may be scanned into the first flip flop 204 via the first test input 214 and into the second flip flop 206 via the second data input 220 (e.g., from the first data output 218 to the second test input 224) according to a test clock signal 236.

After scanning the test input 234 into the first flip flop 204 and into the second flip flop 206, the test enable signal 232 with a low logic value (e.g., a logic value "0") may be provided to the flip flops 204 and 206 to cause the flip flops 204 and 206 to exit the test mode and enter into an operation mode. During the operation mode, the first flip flop 204 may receive data 238 via the first data input 210 and the second flip flop 206 may receive data from the first data output 218 via the second data input 220 in accordance with an operation clock signal 240. The second flip flop 206 may output data via the second data output 228 for failure analysis. After one or more clock cycles of the operation clock signal 240, the first flip flop 204 and the second flip flop 206 may enter the test mode again (e.g., when the test enable signal 232 is transitioned to the high logic value).

During the test mode, the output from the second data output 228 may be analyzed to determine whether the first flip flop 204 and/or the second flip flop 206 have defects. During the operation mode, the output from the second data output 228 may be analyzed to determine whether the yield sensitive circuit 208 has defects. For example, when there is an open path caused by the yield sensitive circuit 208, data from the first data output 218 may not be output by the second data output 228 during the operation mode, as the data may not be received by the second data input 220. When there is a short path caused by the yield sensitive circuit 208, the output from the second data output 228 may indicate a "stuck-at-1" fault or a "stuck-at-0" fault based on a signal (e.g., a voltage source, a ground, etc.) that the yield sensitive circuit 208 is shorted to.

Figure 3:
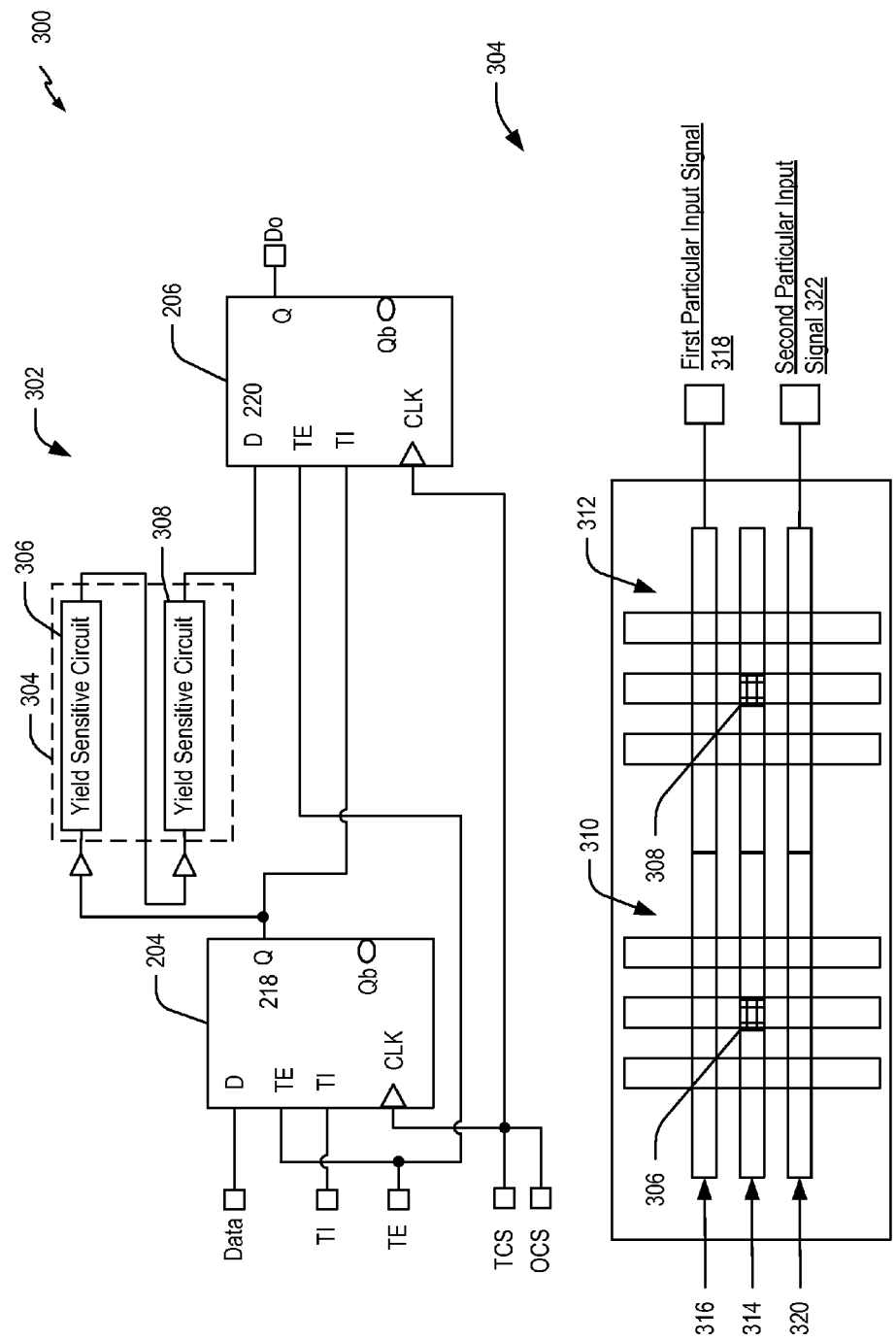
FIG. 3 is a diagram of a particular illustrative embodiment of a scan chain that includes an abutted yield sensitive circuit.

Referring to FIG. 3, a diagram of a particular illustrative embodiment of a scan chain 302 that includes an abutted yield sensitive circuit 304 is disclosed and generally designated 300. The abutted yield sensitive circuit 304 of the scan chain 302 may include a first yield sensitive circuit 306 coupled to a second yield sensitive circuit 308. In a particular embodiment, the first yield sensitive circuit 306 is a different layout pattern than the second yield sensitive circuit 308. For example, the first yield sensitive circuit 306 may be a layout pattern with a different design than the second yield sensitive circuit 308. In another particular embodiment, the first yield sensitive circuit 306 and the second yield sensitive circuit 308 are the same type of layout patterns but with different design parameters (e.g., line width, spacing between metal, area, amount of via enclosure within a pattern, high via density region, low via density region, etc.). In another particular embodiment, the first yield sensitive circuit 306 and the second yield sensitive circuit 308 are the same type of layout patterns with the same parameters (e.g., the second yield sensitive circuit 308 is a copy of the first yield sensitive circuit 306). Although the abutted yield sensitive circuit 304 is shown to include two yield sensitive circuits, it is understood that the abutted yield sensitive circuit 304 may include any number of yield sensitive circuits.

As shown at the bottom of FIG. 3, the abutted yield sensitive circuit 304 may be formed by placing a first cell 310 next to a second cell 312 (e.g., using a circuit design application). The first yield sensitive circuit 306 and the second yield sensitive circuit 308 may be placed in the centers of the first cell 310 and the second cell 312, respectively. A center wire 314 of the abutted yield sensitive circuit 304 may act as a signal path to pass data from the first data output 218 of the first flip flop 204 to the second data input 220 of the second flip flop 206. A first wire 316 of the abutted yield sensitive circuit 304 may be connected to a first particular input signal 318 (e.g., a Vdd) and a second wire 320 may be connected to a second particular input signal 322 (e.g., a Vss). After the abutted yield sensitive circuit 304 is formed, the abutted yield sensitive circuit 304 may be inserted between the first flip flop 204 and the second flip flop 206 using the circuit design application to form the scan chain 302 (within a circuit modeled by the circuit design application). Forming the abutted yield sensitive circuit 304 may reduce connections (e.g., connections to voltage sources) to the first cell 310 and the second cell 312.

Figure 4:
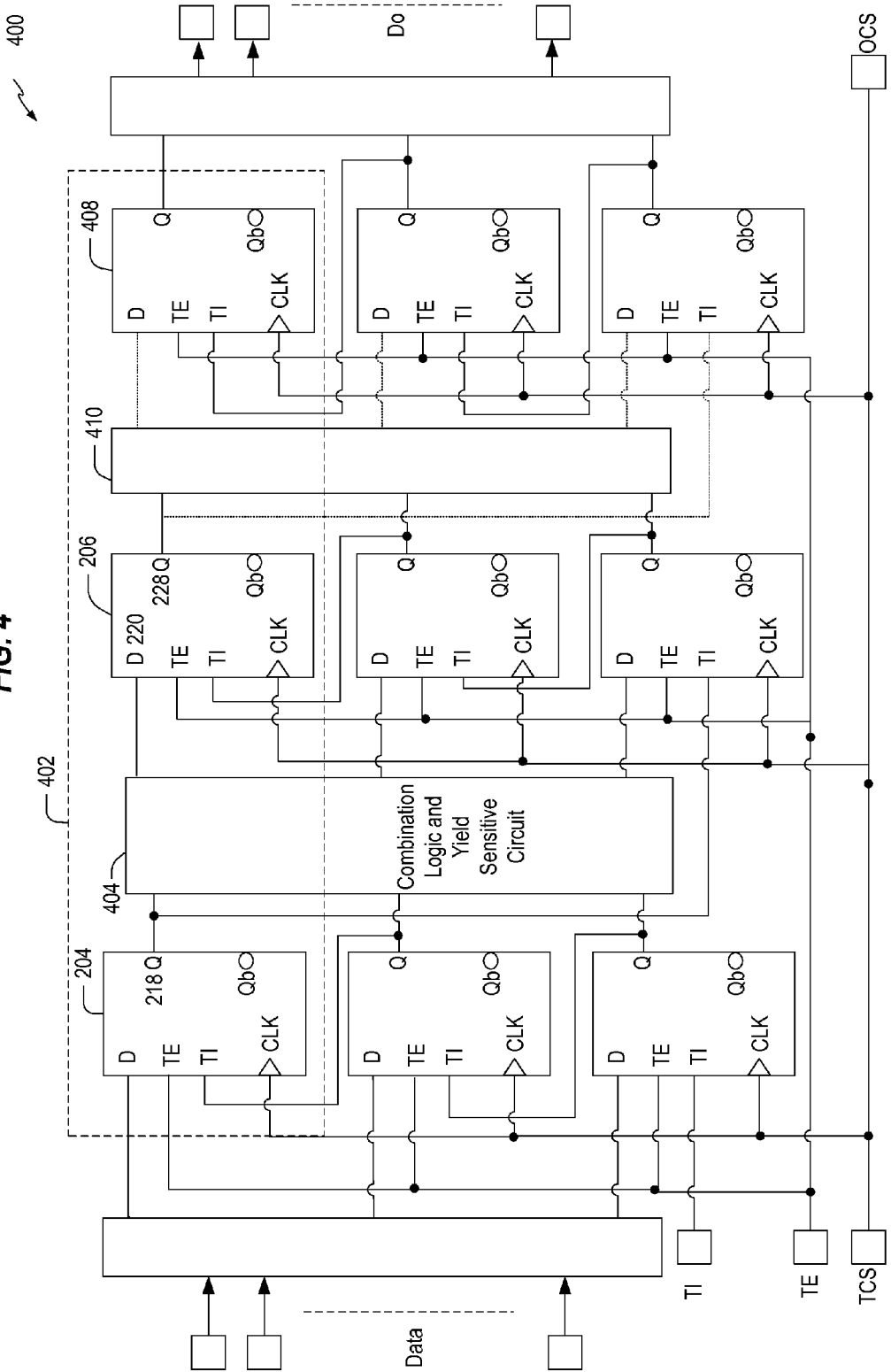
FIG. 4 is a diagram of a particular illustrative embodiment of a scan chain that includes a yield sensitive circuit and combination logic.

Referring to FIG. 4, a diagram of a particular illustrative embodiment of a scan chain 402 that includes a first yield sensitive circuit 404 having a first combinational logic cone (e.g., adders, multiplexers, etc.) is disclosed and generally designated 400. During testing of the first yield sensitive circuit 404, data from the first data output 218 of the first flip flop 204 may be modified by the first combinational logic of the yield sensitive circuit 404 before being received at the second data input 220 of the second flip flop 206. When the modified data is output from the second data output 228, the modified data may be analyzed to determine whether a failure of the yield sensitive circuit 404 is detected. A second yield sensitive circuit 410 may be tested in a similar manner as the first yield sensitive circuit 404 via the second flip flop 206 and a third flip flop 408. Thus, the scan chain 402 may enable testing of yield sensitive circuits that may modify data, instead of yield sensitive circuits that act as data paths. Although FIG. 4 illustrates that the scan chain 402 has three flip flops, it should be understood that the scan chain 402 may include a plurality of pairs of flip flops. Each pair of the plurality of pairs of flip flops may include a combinational logic cone and a yield sensitive circuit.

Figure 5B:
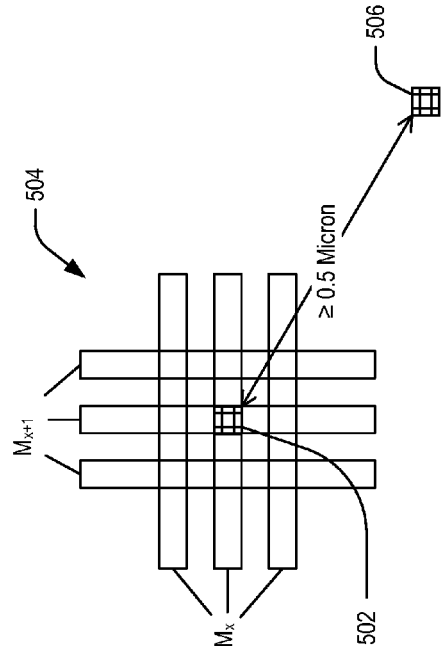
FIG. 5($a$) is a diagram of a particular illustrative embodiment of a first yield sensitive circuit.
Figure 5A:
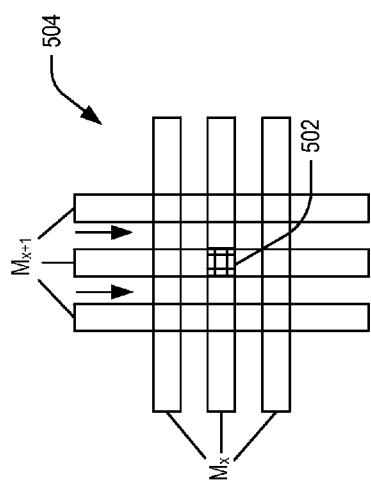

Referring to FIG. 5(a), a diagram of a particular illustrative embodiment of a yield sensitive circuit 502 is disclosed. In a particular embodiment, the yield sensitive circuit 502 is the yield sensitive circuit 208 of FIG. 2. The yield sensitive circuit 502 may be located in the center of a cell 504. The yield sensitive circuit 502 may be a via with no enclosure on two sides along a metal length direction (as indicated by the direction of the arrows). For example, no enclosure may indicate that the via is not covered by any extra metal between two metal layers.

Referring to FIG. 5(b), a diagram of another particular illustrative embodiment of the yield sensitive circuit 502 is disclosed. The yield sensitive circuit 502 may be an isolated via with no enclosure on the two sides along the metal length direction. For example, the yield sensitive circuit 502 may be a via where a particular neighboring via 506 closest to the isolated via is at least half a micron away. The yield sensitive circuit 502 may have minimum spacing to nearby metal wires. For example, the minimum spacing may be a particular amount of spacing between a via and a proximate metal wire, where the particular amount of spacing substantially matches a lower bound of a threshold according to a minimum spacing design rule. For example, a minimum spacing design rule may indicate that a narrowest allowable spacing (e g , minimum spacing) between objects in a design of a semiconductor device is 2 microns.

Figure 5C:
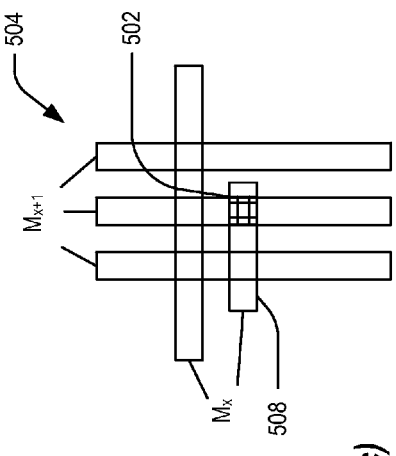

Referring to FIG. 5(c), a diagram of another particular illustrative embodiment of the yield sensitive circuit 502 is disclosed. The yield sensitive circuit 502 may be a via within a metal wire 508 and may have minimum spacing to a proximate metal wire. The metal wire 508 may have a particular area (e.g., the metal wire 508 may have a smaller area than metal wires of the yield sensitive circuit 502 that are within a particular distance). The particular area may substantially match a lower bound of a threshold according to a minimum area design rule.

Referring to FIG. 5(d), a diagram of another particular illustrative embodiment of the yield sensitive circuit 502 is disclosed. The yield sensitive circuit 502 may be an isolated via with no enclosure on two sides along a metal length direction and may have minimum spacing to a proximate metal wire. The yield sensitive circuit 502 may be located in the center of the cell 504, and the cell 504 may be within a low via density region 510. The low via density region 510 may be an area with an amount of vias substantially matching a lower bound of a threshold according to a low via density region design rule.

Referring to FIG. 5(e), a diagram of another particular illustrative embodiment of the yield sensitive circuit 502 is disclosed. The yield sensitive circuit 502 may be an isolated via. For example, the yield sensitive circuit 502 may be a via or a pair of vias where the particular neighboring via 506 closest to the via or the pair of vias is at least five microns away.

Referring to FIG. 5(f), a diagram of another particular illustrative embodiment of the yield sensitive circuit 502 is disclosed. The yield sensitive circuit 502 may be a via with minimum enclosure within a U-shaped metal wire 530. For example, the yield sensitive circuit 502 may have a particular amount of enclosure that substantially matches a first lower bound of a first threshold according to a minimum enclosure design rule. The yield sensitive circuit 502 may have minimum spacing to an enclosed end 512 of the U-shaped metal wire 530. For example, the yield sensitive circuit 502 may have an amount of spacing (to the enclosed end 512 of the U-shaped metal wire 530) that substantially matches a second lower bound of a second threshold according to a minimum spacing design rule.

Referring to FIG. 5(g), a diagram of another particular illustrative embodiment of the yield sensitive circuit 502 is disclosed. The yield sensitive circuit 502 may be a via located on a metal wire 514 having a particular area (e.g., an area that substantially matches a lower bound of a threshold according to a minimum area design rule) and the via may have minimum spacing to an adjacent L-shaped metal wire 516.

Referring to FIG. 5(h), a diagram of another particular illustrative embodiment of the yield sensitive circuit 502 is disclosed. The yield sensitive circuit 502 may be an L-shaped diffusion region with a via 518 having minimum width diffusion (e.g., a particular degree of width diffusion that substantially matches a lower bound of a threshold according to a minimum width diffusion design rule). The L-shaped diffusion region may interact only with the via 518.

Referring to FIG. 5(i), a diagram of another particular illustrative embodiment of the yield sensitive circuit 502 is disclosed. The yield sensitive circuit 502 may include a first metal wire 520 and a second metal wire 522. The first metal wire 520 and the second metal wire 522 may each have a minimum pitch (e.g., a particular amount of spacing between a first center 524 of the first metal wire 520 and a second center 526 of the second metal wire 522 may substantially match a lower bound of a threshold according to a minimum pitch design rule). The first metal wire 520 and the second metal wire 522 may be adjacent to and below a third metal wire 528. The third metal wire 528 may have a greater width than the first metal wire 520 or the second metal wire 522.

Referring to FIG. 6(a), a diagram of a particular illustrative embodiment of a yield sensitive circuit 602 based on an embodiment of a double patterning technique is disclosed. A double patterning technique (e.g., a technique in which two masks may be used to fabricate a single physical layer, such as a metal layer) may be used in a twenty-two nanometer semiconductor fabrication process. During fabrication, a first mask of the single physical layer may be shifted relative to a second mask of the single physical layer due to lithography misalignment between the first mask and the second mask, resulting in a short path. In an illustrative embodiment, the yield sensitive circuit 602 is the yield sensitive circuit 208. The yield sensitive circuit 602 may include a yield sensitive layout. The yield sensitive circuit 602 may be formed by placing the yield sensitive circuit 602 at a center of a cell 604 using the circuit design application. The yield sensitive circuit 602 may be inserted between the first flip flop 204 and the second flip flop 206 and connected to the first flip flop 204 and to the second flip flop 206 using the circuit design application. A center metal wire 608 may be fabricated using a first mask 612. A top metal wire 606 and a bottom metal wire 610 may be fabricated using a second mask 614.

Referring to FIG. 6(b), a diagram of a particular illustrative embodiment of the yield sensitive circuit 602 based on another embodiment of the double patterning technique is disclosed. In FIG. 6(b), the center metal wire 608 and the bottom metal wire 610 may be fabricated using the first mask 612. The top metal wire 606 may be fabricated using the second mask 614.

Referring to FIG. 6(c), a diagram of a particular illustrative embodiment of the yield sensitive circuit 602 based on another embodiment of the double patterning technique is disclosed. In FIG. 6(c), the top metal wire 606, the center metal wire 608, and the bottom metal wire 610 may be fabricated using a single mask (e.g., the first mask 612).

Figure 7:
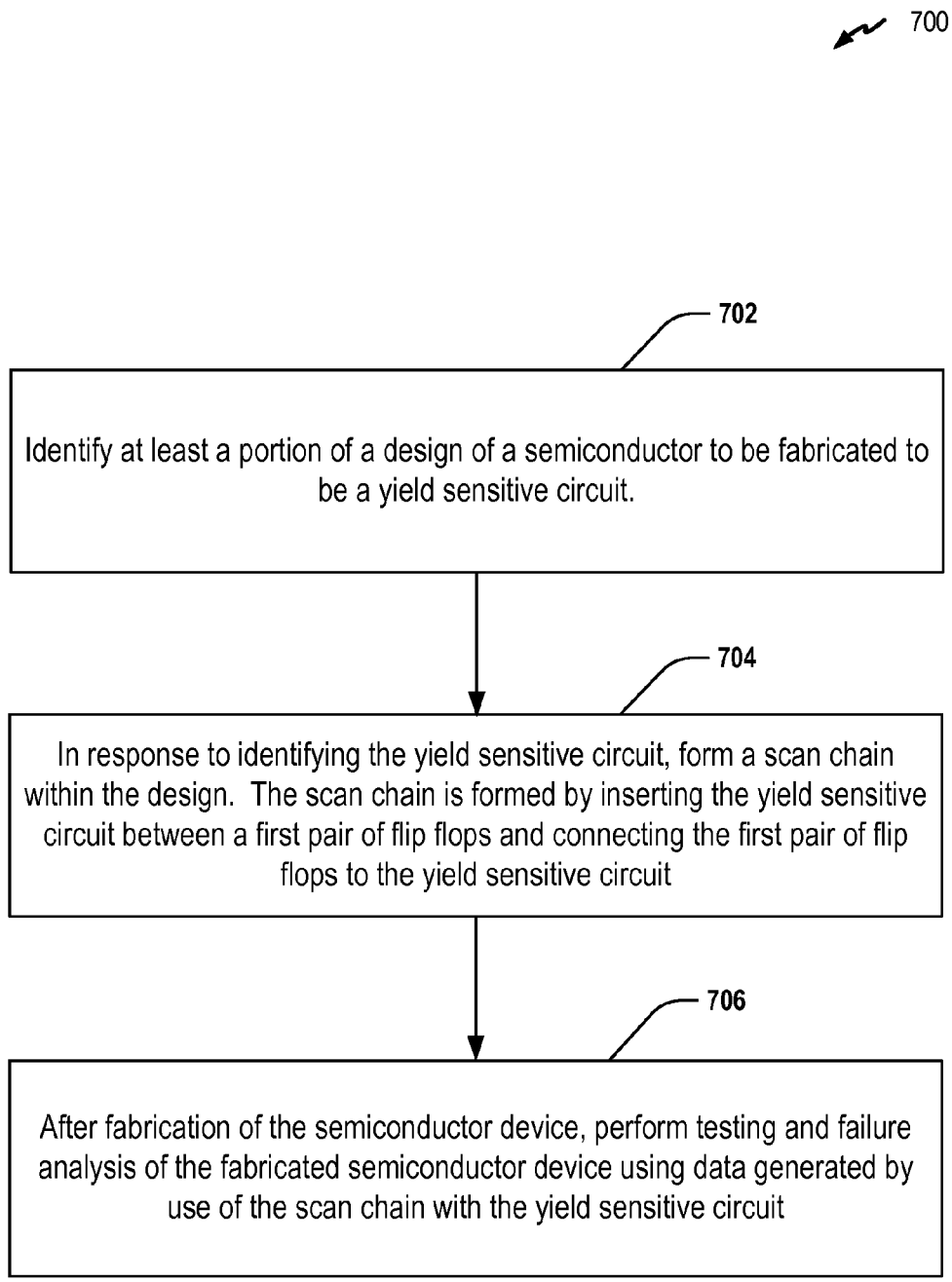
FIG. 7 is a flowchart to illustrate a particular embodiment of a method of testing the yield sensitive circuits of FIGS. 2-6.

Referring to FIG. 7, a flowchart to illustrate a particular embodiment of a method 700 of testing the yield sensitive circuit of FIGS. 2-6 is disclosed. The method 700 includes identifying at least a portion of a design of a semiconductor to be fabricated as a yield sensitive circuit, at 702. For example, referring to FIG. 2, at least a part of the design may be identified as the yield sensitive circuit 208. The method 700 also includes, in response to identifying the yield sensitive circuit, forming a scan chain. The scan chain is formed within the design by inserting a yield sensitive circuit between a first pair of flip flops and connecting the first pair of flip flops to the yield sensitive circuit, at 704. For example, referring to FIG. 2, in response to identifying the yield sensitive circuit 208, the yield sensitive circuit 208 may be inserted between the first flip flop 204 and the second flip flop 206 using the circuit design application. The yield sensitive circuit 208 may also be connected to the first flip flop 204 and to the second flip flop 206 using the circuit design application.

In a particular embodiment, the method 700 further includes, after fabrication of the semiconductor device, performing testing and failure analysis of the fabricated semiconductor device using data (e.g., test output from the scan chain) generated by use of the scan chain with the yield sensitive circuit, at 706. For example, referring to FIG. 2, the yield sensitive circuit 208 may be tested for failure after the semiconductor device is fabricated.

Figure 8:
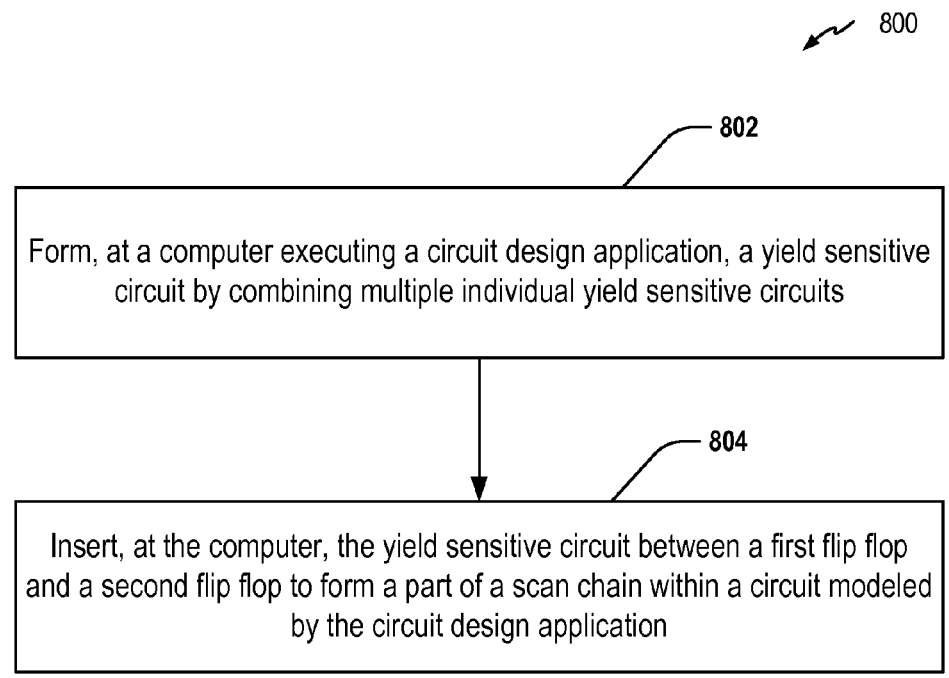
FIG. 8 is a flowchart to illustrate another particular embodiment of a method of testing the yield sensitive circuits of FIGS. 2-6.

Referring to FIG. 8, a flowchart to illustrate a particular embodiment of a method 800 of testing the yield sensitive circuits of FIGS. 2-6 is disclosed. The method 800 may be performed as a part of the method 700 of FIG. 7. The method 800 includes forming, at a computer executing a circuit design application, a yield sensitive circuit by combining multiple individual yield sensitive circuits, at 802. For example, referring to FIG. 3, the abutted yield sensitive circuit 304 may be formed by placing the first cell 310 next to the second cell 312 using a circuit design application.

The method 800 also includes inserting, at the computer, the yield sensitive circuit between a first flip flop and a second flip flop to form a part of a scan chain within a circuit modeled by the circuit design application, at 804. For example, referring to FIG. 3, the abutted yield sensitive circuit 304 may be inserted between the first flip flop 204 and the second flip flop 206 to form the scan chain 302, as shown. The scan chain may be fabricated on a test semiconductor device. Testing and failure analysis may be performed on the test semiconductor device to determine yield loss caused by the yield sensitive circuit. Based on data generated from the testing and failure analysis, a design of a semiconductor device that includes the yield sensitive circuit may be modified to reduce potential yield loss caused by the yield sensitive circuit. Thus, the method 800 may enable testing of a yield sensitive circuit using a scan chain to determine potential yield loss of semiconductor devices having the yield sensitive circuit.

Figure 9:
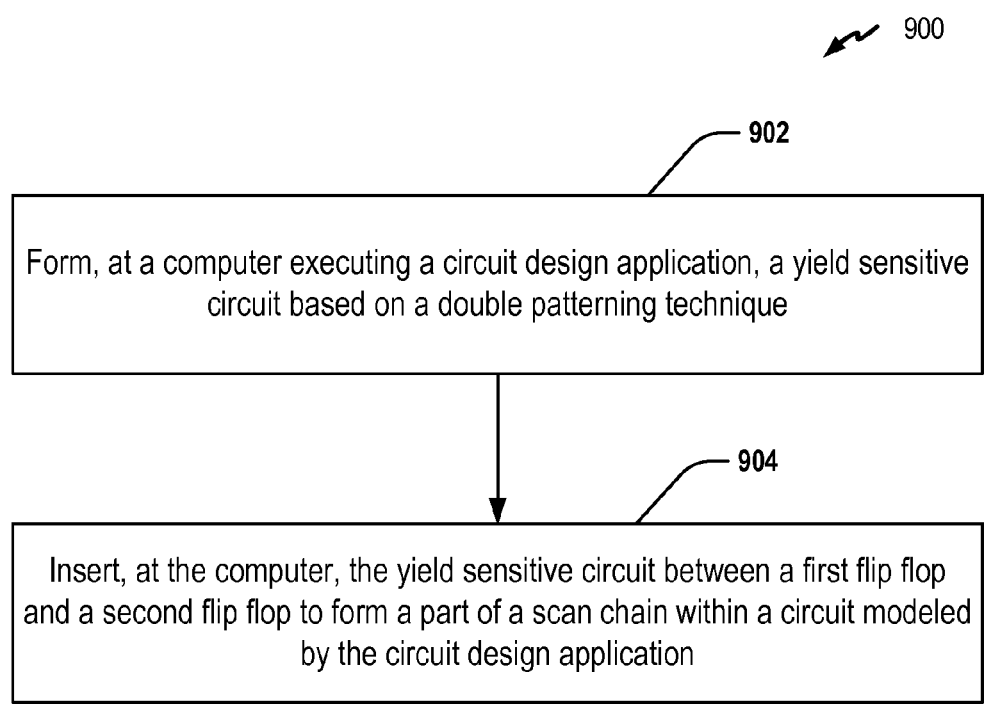
FIG. 9 is a flowchart to illustrate another particular embodiment of a method of testing the yield sensitive circuits of FIGS. 2-6.

Referring to FIG. 9, a flowchart to illustrate a particular embodiment of a method 900 of testing the yield sensitive circuit of FIGS. 2-6 is disclosed. The method 900 may be part of the method 700 of FIG. 7. The method 900 includes forming, at a computer executing a circuit design application, a yield sensitive circuit based on a double patterning technique, at 902. For example, referring to FIG. 6(a), the yield sensitive circuit 602 may be formed by placing the yield sensitive circuit 602 in the center of the cell 604 using a circuit design application.

The method 900 also includes inserting, at the computer, the yield sensitive circuit between a first flip flop and a second flip flop to form a part of a scan chain within a circuit modeled by the circuit design application, at 904. For example, referring to FIG. 6(a), the yield sensitive circuit 602 may be inserted between the first flip flop 204 and the second flip flop 206, as shown. The scan chain may be fabricated on a test semiconductor device based on the double patterning technique. Testing and failure analysis may be performed on the test semiconductor device to determine yield loss caused by the yield sensitive circuit. Based on data generated from the testing and failure analysis, a design of a semiconductor device that includes the yield sensitive circuit may be modified to reduce potential yield loss caused by the yield sensitive circuit. Thus, the method 900 may enable testing of a yield sensitive circuit (formed based on a double patterning technique) using a scan chain to determine potential yield loss of semiconductor devices having the yield sensitive circuit.

Figure 10:
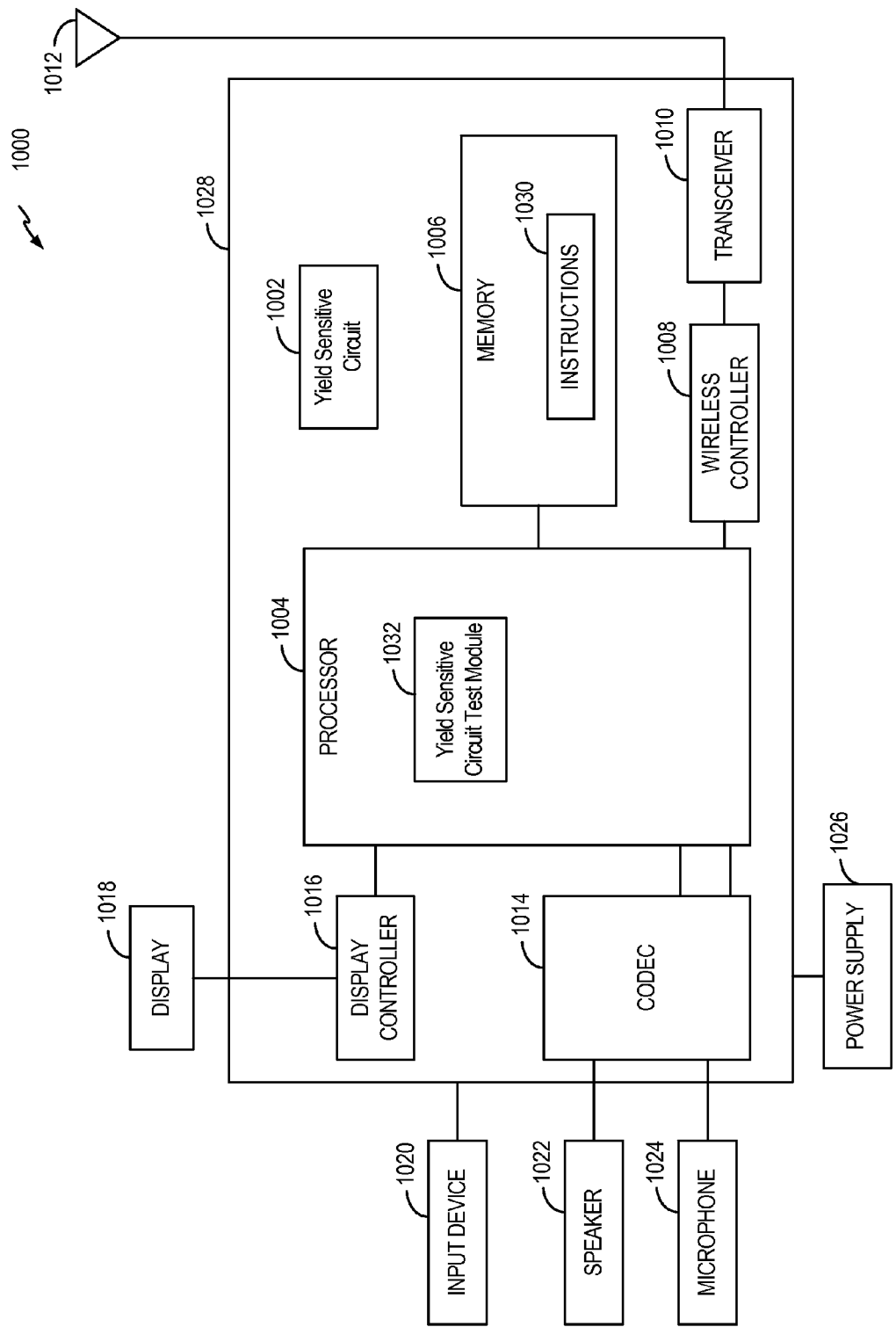
FIG. 10 is a diagram of a communication device including one or more of the yield sensitive circuits of FIGS. 2-6.

Referring to FIG. 10, a diagram of a particular embodiment of a wireless device 1000 including a component having a yield sensitive circuit in accordance with the described embodiments is disclosed. In a particular embodiment, the wireless device 1000 is a test device. The wireless device 1000 may include a yield sensitive circuit 1002 (e.g., as part of a semiconductor device). The yield sensitive circuit 1002 may be a yield sensitive circuit described with respect to any of FIGS. 2-6. The wireless device 1000 may also include a processor, such as a processor 1004, coupled to a memory 1006. The processor 1004 may include a yield sensitive circuit test module 1032. The yield sensitive circuit test module 1032 may be executable by the processor 1004 to cause the processor 1004 to perform testing and failure analysis of the yield sensitive circuit 1002 when the wireless device 1000 includes a test semiconductor device. The yield sensitive circuit test module 1032 may be removed from a final design of the wireless device 1000.

The memory 1006 may be a non-transitory computer-readable storage medium that stores data, instructions, or both. In a particular embodiment, the memory 1006 may include instructions 1030 that may be executable by the processor 1004 to cause the processor 1004 to perform one or more functions of the wireless device 1000. For example, the instructions 1030 may include user applications, an operating system, other executable instructions, or a combination thereof. The instructions 1030 may be executable by the processor 1004 to cause the processor 1004 to perform at least a portion of the functionality described with respect to any of FIGS. 1-9.

The wireless device 1000 may include a transceiver 1010 for sending and receiving signals and/or data packets. For example, the wireless device 1000 may function as a transmitter when the wireless device 1000 transmits signals and/or packets and may function as a receiver when the wireless device 1000 receives signals and/or packets. FIG. 10 also shows a display controller 1016 that may be coupled to the processor 1004 and to a display 1018. A coder/decoder (CODEC) 1014 (e.g., an audio and/or voice CODEC) may be coupled to the processor 1004. A speaker 1022 and a microphone 1024 may be coupled to the CODEC 1014. FIG. 10 also indicates that a wireless controller 1008 may be coupled to the processor 1004 and to the transceiver 1010 that is coupled to an antenna 1012. In a particular embodiment, the processor 1004, the display controller 1016, the memory 1006, the CODEC 1014, the wireless controller 1008, and the transceiver 1010 are included in a system-in-package or system-on-chip device 1028.

In a particular embodiment, an input device 1020 and a power supply 1026 are coupled to the system-on-chip device 1028. Moreover, in a particular embodiment, as illustrated in FIG. 10, the display 1018, the input device 1020, the speaker 1022, the microphone 1024, the antenna 1012, and the power supply 1026 are external to the system-on-chip device 1028. However, each of the display 1018, the input device 1020, the speaker 1022, the microphone 1024, the antenna 1012, and the power supply 1026 can be coupled to a component of the system-on-chip device 1028, such as an interface or a controller.

It should be noted that although FIG. 10 depicts a wireless communications device, the processor 1004 (including the yield sensitive circuit test module 1032 for testing purposes), the memory 1006, and/or the yield sensitive circuit 1002 may be integrated into other devices, such as a multimedia player, an entertainment unit, a navigation device, a personal digital assistant (PDA), a fixed location data unit, or a computer (e.g., a tablet computer, a laptop computer, a desktop computer, etc), a media device, a router or gateway device, or another device configured to wirelessly communicate data.

In addition to the wireless device 1000, at least a portion of the functionality described with respect to any of FIGS. 1-9 may be performed by other apparatus. For example, in conjunction with the described embodiments, a first apparatus may include a substrate. The first apparatus may also include a scan chain formed on the substrate. The scan chain may include at least a first means for storing, a second means for storing, and a yield sensitive circuit configured to provide a path between the first means for storing and the second means for storing. The yield sensitive circuit may be inserted between the first means for storing and the second means for storing within a design of a semiconductor device to be fabricated. After fabrication of the semiconductor device, the fabricated semiconductor device may be configured to be tested and analyzed for failure using data generated by use of the scan chain with the yield sensitive circuit. For example, the first means for storing may include the first flip flop 204 of FIG. 2, the second flip flop 206, the third flip flop 408 of FIG. 4, or one or more components (e.g., a flip flop.) of the wireless device 1000. The second means for storing may include the first flip flop 204 of FIG. 2, the second flip flop 206, the third flip flop 408 of FIG. 4, one or more components (e.g., a flip flop.) of the wireless device 1000.

In a particular embodiment, the first apparatus may further include a particular scan chain formed on the substrate. The particular scan chain may include at least a first particular means for storing, a second particular means for storing, and a particular yield sensitive circuit configured to provide a path between the first particular means for storing and the second particular means for storing. The particular yield sensitive circuit may include multiple individual yield sensitive circuits and may be inserted between the first particular means for storing and the second particular means for storing at a computer executing a circuit design application. For example, the first particular means for storing may include the first flip flop 204 of FIG. 2, the second flip flop 206, the third flip flop 408 of FIG. 4, or one or more components (e.g., a flip flop.) of the wireless device 1000. The second particular means for storing may include the first flip flop 204 of FIG. 2, the second flip flop 206, the third flip flop 408 of FIG. 4, or one or more components (e.g., a flip flop.) of the wireless device 1000.

Figure 11:
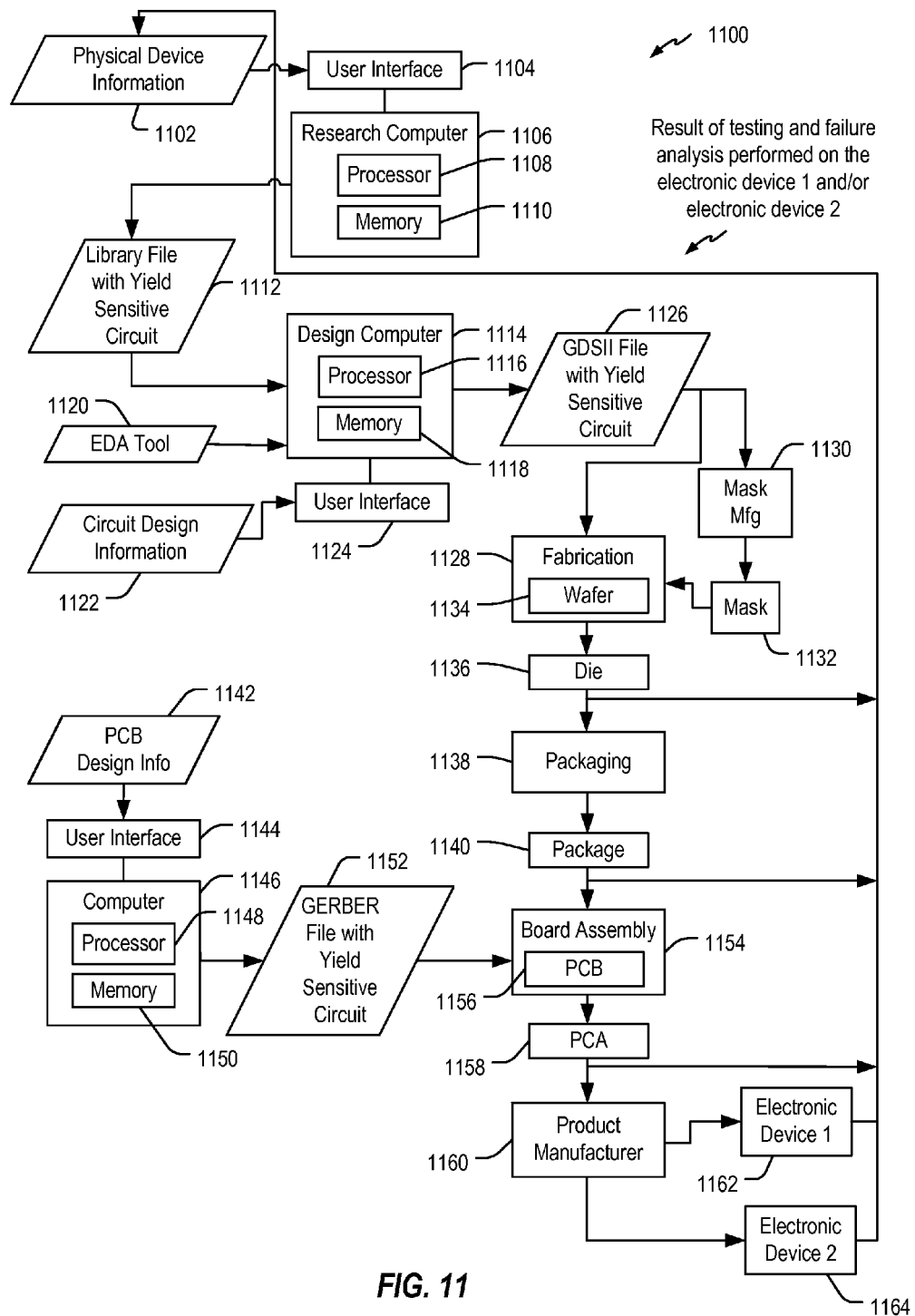
FIG. 11 is a data flow diagram of a particular embodiment of a manufacturing process to manufacture semiconductor devices that include the yield sensitive circuits of FIGS. 2-6.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 11 depicts a particular illustrative embodiment of an electronic device manufacturing process 1100.

Physical device information 1102 is received at the electronic device manufacturing process 1100, such as at a research computer 1106. The physical device information 1102 may include design information representing at least one physical property of a semiconductor device, such as the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof. For example, the physical device information 1102 may include physical parameters, material characteristics, and structure information that is entered via a user interface 1104 coupled to the research computer 1106. The research computer 1106 includes a processor 1108, such as one or more processing cores, coupled to a computer readable medium such as a memory 1110. The memory 1110 may store computer readable instructions that are executable to cause the processor 1108 to transform the physical device information 1102 to comply with a file format and to generate a library file 1112.

In a particular embodiment, the library file 1112 includes at least one data file including the transformed design information. For example, the library file 1112 may include a library of semiconductor devices including a device that includes the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, that is provided to use with an electronic design automation (EDA) tool 1120.

The library file 1112 may be used in conjunction with the EDA tool 1120 at a design computer 1114 including a processor 1116, such as one or more processing cores, coupled to a memory 1118. The EDA tool 1120 and/or a circuit design application and/or a chip design database (e.g., the chip design database 104 of FIG. 1) may be stored as processor executable instructions at the memory 1118 to enable a user of the design computer 1114 to design a circuit including the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, of the library file 1112. For example, a user of the design computer 1114 may enter circuit design information 1122 via a user interface 1124 coupled to the design computer 1114. The circuit design information 1122 may include design information representing at least one physical property of a semiconductor device, such as the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof. To illustrate, the circuit design property may include identification of particular circuits and relationships to other elements in a circuit design, positioning information, feature size information, interconnection information, or other information representing a physical property of a semiconductor device.

The design computer 1114 may be configured to transform the design information, including the circuit design information 1122, to comply with a file format. To illustrate, the file format may include a database binary file format representing planar geometric shapes, text labels, and other information about a circuit layout in a hierarchical format, such as a Graphic Data System (GDSII) file format. The design computer 1114 may be configured to generate a data file including the transformed design information, such as a GDSII file 1126 that includes information describing the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, in addition to other circuits or information. To illustrate, the data file may include information corresponding to a system-on-chip (SOC) that includes the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, and that also includes additional electronic circuits and components within the SOC.

The GDSII file 1126 may be received at a fabrication process 1128 to manufacture the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, according to transformed information in the GDSII file 1126. For example, a device manufacture process may include providing the GDSII file 1126 to a mask manufacturer 1130 to create one or more masks, such as masks to be used with photolithography processing, illustrated as a representative mask 1132. The representative mask 1132 may be used during the fabrication process to generate one or more wafers 1134, which may be tested and separated into dies, such as a representative die 1136. The representative die 1136 includes a circuit including a device that includes the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof.

The representative die 1136 may be provided to a packaging process 1138 where the representative die 1136 is incorporated into a representative package 1140. For example, the representative package 1140 may include the representative die 1136 or multiple dies, such as a system-in-package (SiP) arrangement. The representative package 1140 may be configured to conform to one or more standards or specifications, such as Joint Electron Device Engineering Council (JEDEC) standards.

Information regarding the representative package 1140 may be distributed to various product designers, such as via a component library stored at a computer 1146. The computer 1146 may include a processor 1148, such as one or more processing cores, coupled to a memory 1150. A printed circuit board (PCB) tool may be stored as processor executable instructions at the memory 1150 to process PCB design information 1142 received from a user of the computer 1146 via a user interface 1144. The PCB design information 1142 may include physical positioning information of a packaged semiconductor device on a circuit board, the packaged semiconductor device corresponding to the representative package 1140 including the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof.

The computer 1146 may be configured to transform the PCB design information 1142 to generate a data file, such as a GERBER file 1152 with data that includes physical positioning information of a packaged semiconductor device on a circuit board, as well as layout of electrical connections such as traces and vias, where the packaged semiconductor device corresponds to the representative package 1140 including the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof. In other embodiments, the data file generated by the transformed PCB design information may have a format other than a GERBER format.

The GERBER file 1152 may be received at a board assembly process 1154 and used to create PCBs, such as a representative PCB 1156, manufactured in accordance with the design information stored within the GERBER file 1152. For example, the GERBER file 1152 may be uploaded to one or more machines to perform various steps of a PCB production process. The representative PCB 1156 may be populated with electronic components including the representative package 1140 to form a representative printed circuit assembly (PCA) 1158.

The PCA 1158 may be received at a product manufacture process 1160 and integrated into one or more electronic devices, such as a first representative electronic device 1162 and a second representative electronic device 1164. As an illustrative, non-limiting example, the first representative electronic device 1162, the second representative electronic device 1164, or both, may be selected from the group of a set top box, a music player, a video player, an entertainment unit, a navigation device, a communications device, a personal digital assistant (PDA), a fixed location data unit, and a computer, into which the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof is integrated. As another illustrative, non-limiting example, one or more of the first representative electronic device 1162 and the second representative electronic device 1164 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Embodiments of the disclosure may be suitably employed in any device which includes active integrated circuitry including memory and on-chip circuitry.

Testing and failure analysis may be performed on the first representative electronic device 1162 and/or the second representative electronic device 164 using data generated by use of the proposed yield sensitive circuit 102, the scan chain 202, the scan chain 302, the scan chain 402, or any combination thereof with the yield sensitive circuit 208, the yield sensitive circuit 304, the yield sensitive circuit 404, the yield sensitive circuit 502, the yield sensitive circuit 602, or any combination thereof. A result of the testing and failure analysis may be used to update the physical device information 1102 for a next iteration of fabrication of the first representative electronic device 1162 and/or the second representative electronic device 1164. Alternatively, or in addition, test results may be received from other stages of the electronic device manufacturing process 1100, as shown. For example, test results may be received after the representative die 1136 is fabricated, after the representative package 1140 is fabricated, after the PCA 1158 is fabricated, etc.

A device that includes the proposed yield sensitive circuit 102, the scan chain 202, the yield sensitive circuit 208, the scan chain 302, the yield sensitive circuit 304, the scan chain 402, the yield sensitive circuit 404, the yield sensitive circuit 502, the yield sensitive circuit 602, or any combination thereof, may be fabricated, processed, and incorporated into an electronic device, as described in the electronic device manufacturing process 1100. One or more aspects of the embodiments disclosed with respect to FIGS. 1-10 may be included at various processing stages, such as within the library file 1112, the GDSII file 1126, and the GERBER file 1152, as well as stored at the memory 1110 of the research computer 1106, the memory 1118 of the design computer 1114, the memory 1150 of the computer 1146, the memory of one or more other computers or processors (not shown) used at the various stages, such as at the board assembly process 1154, and also incorporated into one or more other physical embodiments such as the representative mask 1132, the representative die 1136, the representative package 1140, the PCA 1158, other products such as prototype circuits or devices (not shown), or any combination thereof. Although various representative stages of production from a physical device design to a final product are disclosed, in other embodiments fewer stages may be used or additional stages may be included. Similarly, the electronic device manufacturing process 1100 may be performed by a single entity or by one or more entities performing various stages of the electronic device manufacturing process 1100.

One or more of the disclosed embodiments may be implemented in a system or an apparatus that includes a communications device, a fixed location data unit, a mobile location data unit, a mobile phone, a cellular phone, a computer, a tablet, a portable computer, or a desktop computer. Additionally, the system or the apparatus may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-11 illustrate systems, apparatuses, and/or methods according to the teachings of the disclosure, the disclosure is not limited to these illustrated systems, apparatuses, and/or methods. Embodiments of the disclosure may be suitably employed in any device that includes memory, a processor, and circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above may be performed by any suitable means capable of performing the operations, such as various hardware and/or software component(s), circuits, and/or module(s). Generally, any operation illustrated in the FIGS. 1-11 may be performed by corresponding functional means capable of performing the operations. Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer-readable storage media and communication media including any medium that facilitates transfer of computer program data from one place to another. A storage media may be any available media that can be accessed by a computer. By way of example, and not limitation, such computer-readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable storage medium (e.g., tangible media). In addition, in some aspects computer readable medium may include a transitory computer readable medium (e.g., a signal). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow.

Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. A method of designing a semiconductor device within a circuit design application of a computer, comprising:
    determining a design of the semiconductor device to be fabricated at the computer executing the circuit design application;
    identifying, at the computer, at least a portion of the design of the semiconductor device to be a yield sensitive circuit by comparing said at least the portion of the design of the semiconductor device to previously known yield sensitive circuits; and
    forming, at the computer, a scan chain by locating a first pair of flip flops into the semiconductor device such that the yield sensitive circuit, identified by comparing said at least the portion of the design of the semiconductor device to previously known yield sensitive circuits, is between the first pair of flip flops to form the scan chain with the yield sensitive circuit within the design of the semiconductor device, the yield sensitive circuit being connected to the first pair of flip flops, wherein the yield sensitive circuit is located between the first pair of flip flops before performing testing and failure analysis of the semiconductor device.

2. The method of claim 1, wherein the scan chain includes two or more pairs of flip flops, and wherein the scan chain is within the design.

3. The method of claim 1, wherein the scan chain includes at least one logic cone, and wherein the yield sensitive circuit is identified prior to fabricating the semiconductor device.

4. The method of claim 1, wherein the yield sensitive circuit is associated with a layout pattern of the semiconductor device.

5. The method of claim 1, wherein the yield sensitive circuit is compliant with a particular set of design rules, and wherein the semiconductor device is a test device.

6. The method of claim 1, wherein the yield sensitive circuit includes a two dimensional layout pattern.

7. The method of claim 1, further comprising performing testing and failure analysis of the semiconductor device using data generated by use of the scan chain with the yield sensitive circuit.

8. The method of claim 7, wherein a defect of the yield sensitive circuit detected during the testing and failure analysis indicates a failure in a layer of the semiconductor device.

9. The method of claim 7, further comprising:
    generating a second proposed yield sensitive circuit using data from the testing and failure analysis;
    comparing the second proposed yield sensitive circuit to circuit information related to data in a chip design database, wherein the chip design database includes circuit information related to circuits used to design the semiconductor device; and
    identifying a second particular circuit in the chip design database that matches the second proposed yield sensitive circuit as a second particular yield sensitive circuit.

10. The method of claim 9, further comprising:
    forming a second scan chain by locating the second particular yield sensitive circuit between a second pair of flip flops to form the second scan chain within a second design of a second semiconductor device to be fabricated; and
    after fabrication of the second semiconductor device, performing a second testing and failure analysis of the second fabricated semiconductor device using second data generated by use of the second scan chain with the second particular yield sensitive circuit.

11. The method of claim 1, wherein the identifying, at the computer, the at least a portion of the design of the semiconductor device to be a yield sensitive circuit includes:
    comparing a proposed yield sensitive circuit to circuits in a chip design database, wherein the chip design database includes circuit information related to circuits used to design the semiconductor device; and
    identifying a particular circuit in the chip design database that matches the proposed yield sensitive circuit.

12. The method of claim 11, further comprising:
    incorporating the particular circuit into a plurality of design cells, wherein each design cell includes a copy of the particular circuit; and
    forming the yield sensitive circuit using the plurality of design cells.

13. The method of claim 12, further comprising:
    forming a second scan chain by locating a second yield sensitive circuit into a second location between a second pair of flip flops to form the second scan chain within the design of the semiconductor device; and
    after fabrication of the semiconductor device, performing testing and failure analysis of the fabricated semiconductor device using data generated by use of the second scan chain with the second yield sensitive circuit.

14. The method of claim 1, wherein the yield sensitive circuit includes a first particular yield sensitive circuit coupled to a second particular yield sensitive circuit, wherein the first particular yield sensitive circuit is a different circuit than the second particular yield sensitive circuit.

15. The method of claim 1, wherein the yield sensitive circuit is formed using a plurality of design cells through direct abutment.

16. The method of claim 1, further comprising:
    forming a particular yield sensitive circuit by combining multiple individual yield sensitive circuits; and
    forming a part of a particular scan chain by locating the particular yield sensitive circuit between a first flip flop and a second flip flop to form the part of the particular scan chain within a circuit modeled by the circuit design application.

17. The method of claim 16, wherein an output of the particular scan chain indicates a type of failure of the yield sensitive circuit.

18. The method of claim 17, wherein the type of failure is a short path.

19. The method of claim 17, wherein the type of failure is an open path.

20. The method of claim 16, wherein the multiple individual yield sensitive circuits include a first yield sensitive circuit and a second yield sensitive circuit, wherein the second yield sensitive circuit is a variation of the first yield sensitive circuit.

21. The method of claim 16, wherein the yield sensitive circuit includes a first yield sensitive circuit coupled to a second yield sensitive circuit, wherein the first yield sensitive circuit is the same type of layout pattern as the second yield sensitive circuit, and wherein the first yield sensitive circuit has a different design parameter than the second yield sensitive circuit.

22. The method of claim 21, wherein the design parameter includes a line width, a spacing between metal, an area, an enclosure of a via, a high via density region, a low via density region, or a combination thereof.

23. The method of claim 16, wherein the particular yield sensitive circuit includes a via with no enclosure on two sides along a metal length direction and with a particular amount of spacing to a proximate metal wire that substantially matches a lower bound of a threshold.

24. The method of claim 16, wherein the particular yield sensitive circuit includes a via with no enclosure on two sides along a metal length direction and with a particular amount of spacing to a proximate metal wire that substantially matches a lower bound of a threshold, wherein the via is at least half a micron away from a neighboring via.

25. The method of claim 16, wherein the particular yield sensitive circuit includes a via located within a metal wire having a particular area, wherein the via has a particular amount of spacing to a proximate metal wire that substantially matches a lower bound of a threshold.

26. The method of claim 16, wherein the particular yield sensitive circuit includes a via within a low via density region with no enclosure on two sides along a metal length direction and with a particular amount of spacing to a proximate metal wire, wherein the low via density region has a particular amount of vias, wherein the particular amount of spacing substantially matches a lower bound of a threshold, and wherein the via is at least half a micron away from a neighboring via.

27. The method of claim 16, wherein the particular yield sensitive circuit includes a via that is at least five microns away from a neighboring via.

28. The method of claim 16, wherein the particular yield sensitive circuit includes a via with a particular amount of enclosure within a U-shaped metal wire, wherein the via has a particular amount of spacing to an enclosed end of the U-shaped metal wire, wherein the particular amount of enclosure substantially matches a first lower bound of a first threshold, and wherein the particular amount of spacing substantially matches a second lower bound of a second threshold.

29. The method of claim 16, wherein the particular yield sensitive circuit includes a via within a metal wire having a particular area, wherein the via has a particular amount of spacing to an adjacent L-shaped metal wire, wherein the particular area substantially matches a first lower bound of a first threshold, and wherein the particular amount of spacing substantially matches a second lower bound of a second threshold.

30. The method of claim 16, wherein the particular yield sensitive circuit includes a L-shaped diffusion region with a via having a particular degree of width diffusion, wherein the particular degree substantially matches a lower bound of a threshold.

31. The method of claim 16, wherein the particular yield sensitive circuit includes a first metal wire having a first center and a second metal wire having a second center, wherein the first metal wire and the second metal wire are adjacent to and below a third metal wire, wherein the first center has a particular amount of spacing to the second center, wherein the particular amount of spacing substantially matches a lower bound of a threshold, and wherein the third metal wire has a greater width than the first metal wire and the second metal wire.

32. The method of claim 1, further comprising:
forming a particular yield sensitive circuit based on a double patterning technique; and
forming a part of a particular scan chain by locating the particular yield sensitive circuit between a first flip flop and a second flip flop to form the part of the particular scan chain within a circuit modeled by the circuit design application.

33. The method of claim 32, wherein the particular yield sensitive circuit is located during a test phase of a semiconductor device development cycle.

34. The method of claim 32, wherein the particular yield sensitive circuit is located during a production phase of a semiconductor device development cycle.

35. The method of claim 32, wherein the double patterning technique includes using two masks to form a physical layer of the semiconductor device.

36. The method of claim 32, wherein the particular yield sensitive circuit includes a yield sensitive layout, wherein the yield sensitive layout is located at a center of a cell, wherein a center metal wire of the cell and a top metal wire of the cell are fabricated using a first mask, and wherein a bottom metal wire of the cell is fabricated using a second mask.

37. The method of claim 32, wherein the particular yield sensitive circuit includes a yield sensitive layout, wherein the yield sensitive layout is located at a center of a cell, wherein a center metal wire of the cell and a bottom metal wire of the cell are fabricated using a first mask, and wherein a top metal wire of the cell is fabricated using a second mask.

38. The method of claim 32, wherein the particular yield sensitive circuit includes a yield sensitive layout, wherein the yield sensitive layout is located at a center of a cell, wherein a center metal wire of the cell, a top metal wire of the cell, and a bottom metal wire of the cell are fabricated using a first mask.

39. An apparatus comprising:
a substrate; and
a scan chain formed on the substrate, wherein the scan chain includes at least a yield sensitive circuit identified by comparing at least a portion of a design of a semiconductor device to previously known yield sensitive circuits, a first flip flop, and a second flip flop, wherein the scan chain is formed by locating the yield sensitive circuit between the first flip flop and the second flip flop within the design of the semiconductor device to be fabricated, and the yield sensitive circuit is configured to provide a path between the first flip flop and the second flip flop, wherein the yield sensitive circuit is located between the first flip flop and the second flip flop before performing testing and failure analysis of the semiconductor device, and wherein after fabrication of the semiconductor device, the fabricated semiconductor device is configured to be tested and analyzed for failure using data generated by use of the scan chain with the yield sensitive circuit.

40. The apparatus of claim 39, further comprising:
a particular scan chain formed on the substrate, wherein the particular scan chain includes at least a first particular flip flop, a second particular flip flop, and a particular yield sensitive circuit configured to provide a path between the first particular flip flop and the second particular flip flop, wherein the particular yield sensitive circuit includes multiple individual yield sensitive circuits and wherein the particular yield sensitive circuit is located between the first particular flip flop and the second particular flip flop at a computer executing a circuit design application.

41. An apparatus comprising:
a substrate; and a scan chain formed on the substrate, wherein the scan chain includes at least a yield sensitive circuit identified by comparing at least a portion of a design of a semiconductor device to previously known yield sensitive circuits, a first means for storing, and a second means for storing, wherein the scan chain is formed by locating the yield sensitive circuit between the first means for storing and the second means for storing within the design of the semiconductor device to be fabricated, and the yield sensitive circuit is configured to provide a path between the first means for storing and the second means for storing and, wherein the yield sensitive circuit is located between the first means for storing and the second means for storing before performing testing and failure analysis of the semiconductor device, and wherein after fabrication of the semiconductor device, the fabricated semiconductor device is configured to be tested and analyzed for failure using data generated by use of the scan chain with the yield sensitive circuit.

42. The apparatus of claim 41, further comprising:

a particular scan chain formed on the substrate, wherein the particular scan chain includes at least a first particular means for storing, a second particular means for storing, and a particular yield sensitive circuit configured to provide a path between the first particular means for storing and the second particular means for storing, wherein the particular yield sensitive circuit includes multiple individual yield sensitive circuits and wherein the particular yield sensitive circuit is located between the first particular means for storing and the second particular means for storing at a computer executing a circuit design application.

43. A non-transitory computer-readable storage medium including instructions that, when executed by a processor, cause the processor to:

identify, at a computer executing a circuit design application, at least a portion of a design of a semiconductor device to be a yield sensitive circuit by comparing said at least the portion of the design of the semiconductor device to previously known yield sensitive circuits; and form, at the computer, a scan chain by locating the yield sensitive circuit between a first flip flop and a second flip flop, the yield sensitive circuit identified by comparing said at least the portion of the design of the semiconductor device to previously known yield sensitive circuits, to form a part of a scan chain with the yield sensitive circuit within the design of the semiconductor device, the yield sensitive circuit being connected to the first flip flop and the second flip flop, wherein the yield sensitive circuit is located between the first flip flop and the second flip flop before performing testing and failure analysis of the semiconductor device.

* * * * *